(12) United States Patent
Kim et al.

(10) Patent No.: US 11,848,343 B2
(45) Date of Patent: Dec. 19, 2023

(54) SPECTRAL FILTER, AND IMAGE SENSOR AND ELECTRONIC DEVICE INCLUDING THE SPECTRAL FILTER

(71) Applicant: SAMSUNG ELECTRONICS CO., LTD., Suwon-si (KR)

(72) Inventors: Hyochul Kim, Yongin-si (KR); Younggeun Roh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 177 days.

(21) Appl. No.: 17/367,759

(22) Filed: Jul. 6, 2021

(65) Prior Publication Data

US 2022/0020796 A1 Jan. 20, 2022

(30) Foreign Application Priority Data

| Jul. 20, 2020 | (KR) | .................. 10-2020-0089857 |
| May 11, 2021 | (KR) | .................. 10-2021-0060948 |
| Jun. 2, 2021 | (KR) | .................. 10-2021-0071713 |

(51) Int. Cl.
*G02B 5/28* (2006.01)
*H01L 27/146* (2006.01)

(52) U.S. Cl.
CPC ........ *H01L 27/14621* (2013.01); *G02B 5/288* (2013.01); *H01L 27/14643* (2013.01)

(58) Field of Classification Search
CPC .... G01B 2290/25; G02B 5/201; G02B 5/284; G02B 5/285–288; G01J 2003/2826; G01J 3/26; G01J 3/2823; G01J 3/36
See application file for complete search history.

(56) References Cited

U.S. PATENT DOCUMENTS

| 5,726,805 A | 3/1998 | Kaushik et al. |
| 9,645,075 B2 | 5/2017 | Choi |
| 2003/0134521 A1* | 7/2003 | Guo ................. H01L 21/31116 |
| | | 257/E21.252 |
| 2015/0144770 A1 | 5/2015 | Choi |

(Continued)

FOREIGN PATENT DOCUMENTS

| CN | 101378067 B | 9/2010 |
| CN | 110703375 A | 1/2020 |

(Continued)

OTHER PUBLICATIONS

Communication dated Dec. 6, 2021 by the European Patent Office in counterpart European Patent Application No. 21183533.5.

*Primary Examiner* — Jonathan Y Jung
(74) *Attorney, Agent, or Firm* — Sughrue Mion, PLLC

(57) ABSTRACT

Provided are a spectral filter, a method of manufacturing the same, and an image sensor and an electronic device each including the spectral filter. The spectral filter includes a plurality of first reflective layers provided spaced apart from each other, and a plurality of cavities provided between the plurality of first reflective layers. The cavities have different thicknesses according to a center wavelength. Each of the cavities includes a plurality of etch stop layers having a constant total thickness according to the center wavelength, and at least one dielectric layer having a total thickness which changes according to the center wavelength, wherein the etch stop layers include materials having etch selectivities different than that of the dielectric layer.

42 Claims, 40 Drawing Sheets

(56) References Cited

U.S. PATENT DOCUMENTS

| | | | |
|---|---|---|---|
| 2015/0371579 A1* | 12/2015 | Yu | G09G 3/3208 |
| | | | 345/690 |
| 2017/0005132 A1* | 1/2017 | Vereecke | G01J 3/0259 |
| 2017/0059754 A1* | 3/2017 | Frey | G01J 3/2823 |
| 2018/0267220 A1* | 9/2018 | Frey | G02B 5/286 |
| 2019/0004222 A1 | 1/2019 | Hwang et al. | |
| 2019/0187347 A1 | 6/2019 | Bilger et al. | |
| 2020/0109991 A1 | 4/2020 | Tack et al. | |
| 2020/0142111 A1 | 5/2020 | Houck et al. | |
| 2021/0033466 A1 | 2/2021 | Kim et al. | |
| 2022/0003906 A1 | 1/2022 | Kim et al. | |
| 2022/0028909 A1 | 1/2022 | Kim et al. | |
| 2022/0128407 A1 | 4/2022 | Lee et al. | |
| 2022/0342129 A1 | 10/2022 | Lee et al. | |
| 2022/0342130 A1 | 10/2022 | Kim et al. | |

FOREIGN PATENT DOCUMENTS

| | | | |
|---|---|---|---|
| EP | 1784677 B1 | 5/2011 | |
| KR | 1020180015067 A | 2/2018 | |
| KR | 1020210014491 A | 2/2021 | |
| KR | 10-2021-0125397 A | 10/2021 | |

\* cited by examiner

SPECTRAL FILTER, AND IMAGE SENSOR AND ELECTRONIC DEVICE INCLUDING THE SPECTRAL FILTER

CROSS-REFERENCE TO RELATED APPLICATIONS

This application is based on and claims priority under 35 U.S.C. § 119 to Korean Patent Application Nos. 10-2020-0089857, filed on Jul. 20, 2020, 10-2021-0060948, filed on May 11, 2021, and 10-2021-0071713, filed on Jun. 2, 2021 in the Korean Intellectual Property Office, the disclosures of which are incorporated by reference herein in their entirety.

BACKGROUND

1. Field

The disclosure relates to a spectral filter, and an image sensor and an electronic device each including the spectral filter.

2. Description of the Related Art

Image sensors using spectral filters are one of important optical instruments in the field of optics. Image sensors according to the related art, including various optical devices, are bulky and heavy. Recently, according to the demand for miniaturization of image sensors, research has been conducted to simultaneously implement an integrated circuit and an optical element on a single semiconductor chip.

SUMMARY

Provided are a spectral filter, and an image sensor and an electronic device each including the spectral filter.

Additional aspects will be set forth in part in the description which follows and, in part, will be apparent from the description, or may be learned by practice of example embodiments of the disclosure.

According to an aspect of the disclosure, a spectral filter may comprise: a plurality of first reflective layers spaced apart from each other and facing each other; and at least a first cavity and a second cavity provided between the plurality of first reflective layers, wherein the first cavity has a different thickness than the second cavity, a thickness of the first cavity determined according to a first center wavelength, and a thickness of the second cavity determined according to a second center wavelength, wherein each of the first cavity and the second cavity includes a plurality of etch stop layers having a constant total thickness and the first cavity has one or more dielectric layers having a first total thickness, and the second cavity has one or more dielectric layers having a second total thickness, wherein the first total thickness and the second total thickness differ from each other according to the first center wavelength of the first cavity and the second center wavelength of the second cavity.

The spectral filter may further comprise a third cavity, and wherein the first cavity, the second cavity, and third cavity are arranged in a two dimensional manner between the plurality of first reflective layers.

The spectral filter may have a difference between a refractive index of a material included in the one or more dielectric layers and refractive indices of materials included in the etch stop layers may be less than or equal to 2.5. The spectral filter may have a difference between the refractive index of the material included in the one or more dielectric layers and the refractive indices of the materials included in the etch stop layers may be less than or equal to 1.

The spectral filter may have one or more dielectric layers including a silicon, a silicon oxide or a silicon nitride. The spectral filter may have the etch stop layers include a silicon oxide, a titanium oxide, or a hafnium oxide, and wherein the etch stop layers include materials having etch selectivity that differ from etch selectivity of the one or more dielectric layers by a factor of 5 or more.

The spectral filter may have one or more dielectric layers and the etch stop layers respectively include a silicon nitride and a hafnium oxide, a silicon nitride and a titanium oxide, a silicon oxide and a hafnium oxide, a silicon oxide and a titanium oxide, or silicon and a silicon oxide.

The spectral filter may have first reflective layers includes a metal reflective layer. The spectral filter may have the metal reflective layer include Al, Cu, Ag, Au, or TiN. The spectral filter have the first reflective layers include a Bragg reflective layer.

The spectral filter may have a first transmittance dielectric layer for improving transmittance provided below a lower one of the plurality of first reflective layers and a second transmittance dielectric layer provided above an upper one of the plurality of first reflective layers.

The spectral filter may have the first transmittance dielectric layer and the second transmittance dielectric layer each have thicknesses which respectively change according to center wavelengths of the first cavity and the second cavity.

The spectral filter may further comprise a plurality of second reflective layers provided laterally to one side of the plurality of first reflective layers; and at least a third cavity and a fourth cavity provided between the plurality of second reflective layers, wherein the third cavity has a different thickness than the fourth cavity, wherein each of the third cavity and fourth cavity includes the plurality of etch stop layers, and the third cavity and fourth cavity includes the one more dielectric layers.

The spectral filter may comprise at least one of the third cavity and the fourth cavity further includes at least one spacer for adjusting thickness.

The spectral filter may comprise the second reflective layers including a metal reflective layer or a Bragg reflective layer.

The spectral filter may include a first transmittance dielectric layer for improving transmittance is provided below a lower one of the plurality of second reflective layers and a second transmittance dielectric layer is provided above an upper one of the plurality of second reflective layers.

A method of manufacturing a spectral filter may comprise forming a first etch stop layer and a first dielectric layer, in this order, on a lower reflective layer; etching a part of the first dielectric layer to expose a part of the first etch stop layer; forming a second etch stop layer and a second dielectric layer, in this order, on the exposed part of the first etch stop layer and on the first dielectric layer; etching a part of the second dielectric layer to expose a part of the second etch stop layer; wherein at least a top of the second dielectric layer and a top of the exposed part of the second etch stop layer form respective boundaries of a first cavity and a second cavity having different thicknesses from each other; and forming an upper reflective layer on the first cavity and the second cavity The method may further comprise: after etching the part of the second dielectric layer to expose the portion of the second etch stop layer, forming a third etch stop layer and a third dielectric layer, in this order, on the exposed part of the second etch stop layer and on the second dielectric layer; and etching a part of the third dielectric layer to expose a part of the third etch stop layer.

The method may comprise a difference between refractive indices of materials included in the first dielectric layer and the second dielectric layer and refractive indices of materials included in the first etch stop layer and the second etch stop layer being less than or equal to 2.5. The method may comprise the difference between the refractive indices of the materials included in the first dielectric layer and the second dielectric layer and the refractive indices of the materials included in the first etch stop layer and the second etch stop layer being less than or equal to 1.

The method may comprise the first dielectric layer and the second dielectric layer including a silicon, a silicon oxide or a silicon nitride, and wherein the first etch stop layer and the second etch stop layer include materials having etch selectivity that differ from etch selectivity of the first dielectric layer and the second dielectric layer by a factor of 5 or more.

The method may comprise the first etch stop layer and the second etch stop layer including a silicon oxide, a titanium oxide, or a hafnium oxide.

The method may further comprise forming at least one spacer for adjusting thickness in at least one of the first cavity and the second cavity.

The method may comprise each of the lower reflective layer and the upper reflective layer including a metal reflective layer or a Bragg reflective layer.

The method may comprise each of the lower reflective layer and the upper reflective layer including a first metal reflective layer and a second metal reflective layer arranged on a plane.

The method may comprise each of the lower reflective layer and the upper reflective layer includes a metal reflective layer and a Bragg reflective layer arranged on a plane.

The method may further comprise forming a first transmittance dielectric layer for improving transmittance below the lower reflective layer and forming a second transmittance dielectric layer above the upper reflective layer.

The method may further comprise the first transmittance dielectric layer for improving transmittance is formed to have different thicknesses according to a center wavelength.

An image sensor may comprise a spectral filter; and a pixel array receiving light transmitted through the spectral filter, wherein the spectral filter comprises: a plurality of first reflective layers spaced apart from each other and facing each other; and at least a first cavity and a second cavity provided between the plurality of first reflective layers, wherein the first cavity has a different thickness than the second cavity, a thickness of the first cavity determined according to a first center wavelength, and a thickness of the second cavity determined according to a second center wavelength, wherein each of the first cavity and the second cavity includes a plurality of etch stop layers having a constant total thickness and the first cavity has one or more dielectric layers having a first total thickness, and the second cavity has one or more dielectric layers having a second total thickness, wherein the first total thickness and the second total thickness differ from each other according to the first center wavelength of the first cavity and the second center wavelength of the second cavity.

The image sensor may comprise a difference between a refractive index of a material included in the one or more dielectric layers and refractive indices of the materials included in the etch stop layers being less than or equal to 2.5. The image sensor may comprise the difference between the refractive index of the material included in the one or more dielectric layers and the refractive indices of the materials included in the etch stop layers being less than or equal to 1.

The image sensor may comprise the one or more dielectric layers including a silicon, a silicon oxide, or a silicon nitride.

The image sensor may comprise the etch stop layers including a silicon oxide, a titanium oxide, or a hafnium oxide, and wherein the etch stop layers include materials having etch selectivity that differ from etch selectivity of the one or more dielectric layers by a factor of 5 or more.

The image sensor may comprise first reflective layers including a metal reflective layer or a Bragg reflective layer.

The image sensor may have a spectral filter further comprising a plurality of second reflective layers provided laterally to one side of the plurality of first reflective layers; and at least a third cavity and a fourth cavity provided between the plurality of second reflective layers, wherein the third cavity has a different thickness than the fourth cavity, and wherein each of the third cavity and the fourth cavity includes the plurality of etch stop layers, and the third cavity and the fourth cavity include one or more dielectric layers.

The image sensor may comprise at least one of the third cavity and the fourth cavity further includes at least one spacer for adjusting thickness.

The image sensor may comprise the second reflective layers include a metal reflective layer or a Bragg reflective layer.

The image sensor may further comprise one or more processors configured to operate as a timing controller, a row decoder, and an output circuit.

An electronic device may comprise the image sensor. The electronic device may be one of: a mobile phone, a smartphone, a tablet, a smart tablet, a digital camera, a camcorder, a notebook computer, a television, a smart television, a smart refrigerator, a security camera, a robot, or a medical camera.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1:
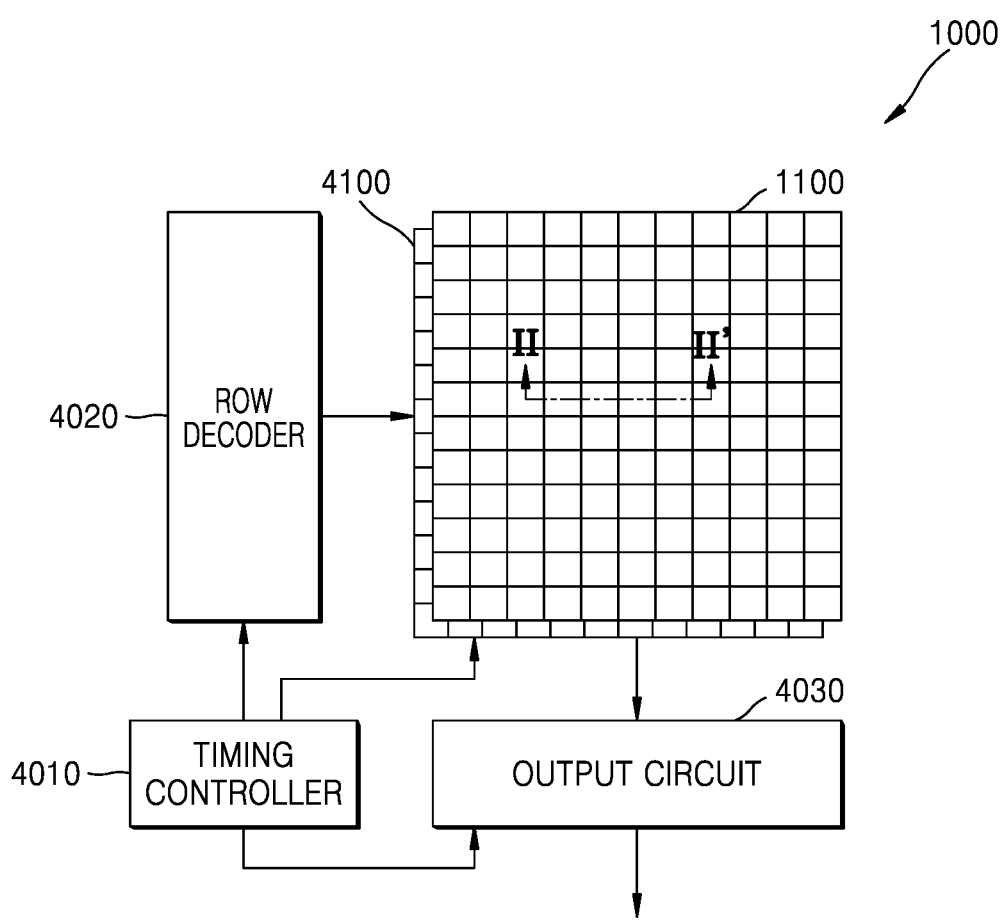
FIG. 1 is a block diagram of an image sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The size of each constituent element illustrated in the drawings may be exaggerated for convenience of explanation and clarity. Although example embodiments have been described, these are merely exemplary, and those skilled in the art to which the present disclosure pertains could make various modifications and changes from these descriptions.

When a constituent element is disposed "above" or "on" another constituent element, the constituent element may include not only an element directly contacting on the upper/lower/left/right sides of the other constituent element, but also an element disposed above/under/left/right the other constituent element in a non-contact manner. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps.

Furthermore, terms such as "portion," "unit," "module," etc. stated in the specification may signify a unit to process at least one function or operation, and the unit may be embodied by hardware, software, or a combination of hardware and software.

Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language (e.g., "such as") provided herein, is intended merely to better illuminate the disclosure and does not pose a limitation on the scope of the disclosure unless otherwise claimed.

FIG. 1 is a schematic block diagram of an image sensor 1000 according to an example embodiment.

Referring to FIG. 1, the image sensor 1000 may include a spectral filter 1100, a pixel array 4100, a timing controller 4010, a row decoder 4020, and an output circuit 4030. The image sensor 1000 may include a charge coupled device (CCD) image sensor or a complementary metal oxide semiconductor (CMOS) image sensor, but the disclosure is not limited thereto.

The spectral filter 1100 may include a plurality of unit filters that transmit light of different wavelength ranges and are arranged in two dimensions. The pixel array 4100 may include a plurality of pixels that detect light of different wavelengths that transmitted through the unit filters. In detail, the pixel array 4100 may include pixels arranged in two dimensions along a plurality of rows and columns. The row decoder 4020 may select one of the rows of the pixel array 4100 in response to a row address signal output from the timing controller 4010. The output circuit 4030 may output a light detection signal in units of columns from the pixels arranged in a selected row. To this end, the output circuit 4030 may include a column decoder and an analog to digital converter (ADC). For example, the output circuit 4030 may include a plurality of ADCs arranged for each column between the column decoder and the pixel array 4100, or a single ADC arranged at an output end of the column decoder. The timing controller 4010, the row decoder 4020, and the output circuit 4030 may be implemented by a single chip or separate chips. A processor for processing an image signal output through the output circuit 4030 may be implemented by a single chip with the timing controller 4010, the row decoder 4020, and the output circuit 4030. The pixel array 4100 may include a plurality of pixels that detect light of different wavelengths, and the pixels may be arranged in various methods.

Figure 2:
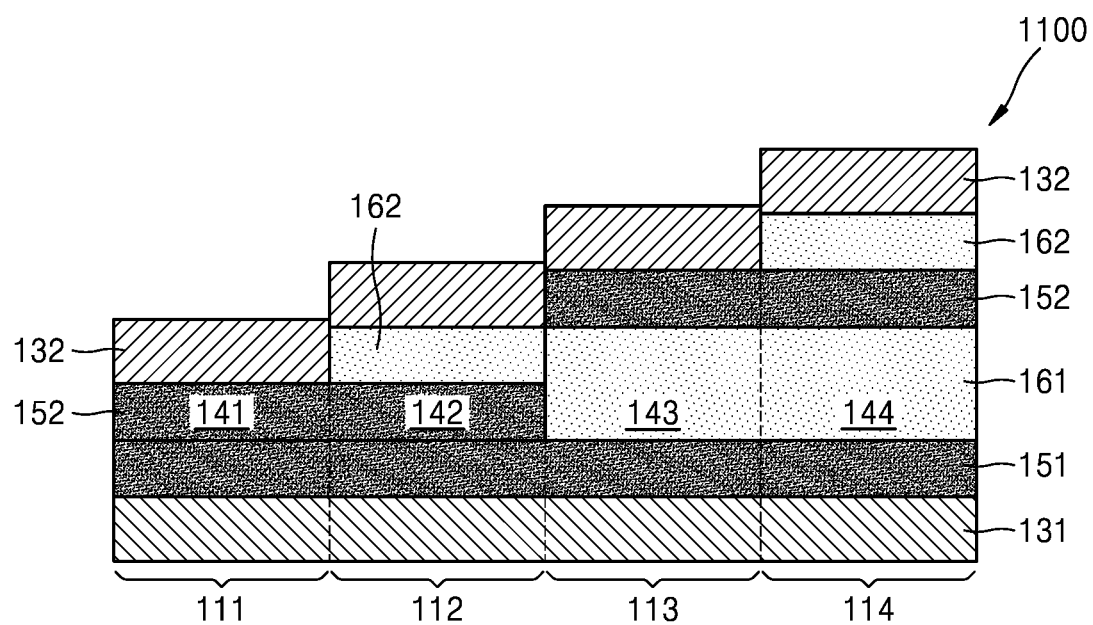
FIG. 2 is a cross-sectional view of a spectral filter taken along line II-II' of FIG. 1.

In the following description, the spectral filter 1100 of the image sensor 1000 is described in detail. FIG. 2 is a schematic cross-sectional view of a spectral filter taken along line II-II' of FIG. 1.

Referring to FIGS. 1 and 2, the spectral filter 1100 may include a plurality of unit filters 111, 112, 113, and 114, which are arranged in a two dimensional manner on a plane. FIG. 2 illustrates an example of four unit filters, e.g., the first, second, third and fourth unit filters 111, 112, 113, and 114.

Each of the first to fourth unit filters 111, 112, 113, and 114 may transmit light having a specific center wavelength, and have a Fabry-Perot structure in which first, second, third, and fourth cavities 141, 142, 143, and 144 are provided between two metal reflective layers 131 and 132 spaced apart from each other. FIG. 2 shows the reflective layers 131, 132 as vertically spaced.

When light is incident on the first, second, third, and fourth cavities 141, 142, 143, and 144 by transmitting through one of the metal reflective layers 131 and 132, the light may reciprocate between the metal reflective layers 131 and 132 inside the first, second, third, and fourth cavities 141, 142, 143, and 144 during which a constructive interference and a destructive interference occur. Light having a specific center wavelength and satisfying a constructive interference condition may exit to the outside of the first, second, third and fourth unit filters 111, 112, 113, and 114. The wavelength band and the center wavelength of the light passing through the unit filters 111, 112, 113, and 114 may be determined according to a reflection band of the metal reflective layers 131 and 132 and the characteristics of the first, second, third, and fourth cavities 141, 142, 143, and 144. As examples, the cavity length, the effective refractive index, and the skin depth of the metal reflective layers are parameters that determine the center wavelength.

As for the metal reflective layers 131 and 132, a first metal may include, for example, Al, Cu, Ag, Au, TiN, and the like. However, the disclosure is not limited thereto. Although the metal reflective layers 131 and 132 may have a thickness of tens of nanometers, the disclosure is not limited thereto.

The first, second, third, and fourth units filters 111, 112, 113, and 114 may be configured to have different center wavelengths. To this end, the first, second, third, and fourth unit filters 111, 112, 113, and 114 may include first, second, third, and fourth cavities 141, 142, 143, and 144 having different thicknesses according to a center wavelength.

Specifically, each of the first, second, third, and fourth cavities 141, 142, 143, and 144 may include a plurality of etch stop layers stacked vertically. Here, a plurality of etch stop layers 151 and 152 may be configured to have a constant total thickness according to the center wavelength. FIG. 2 illustrates a case in which each of the first, second, third and fourth cavities 141, 142, 143, and 144 includes the first and second etch stop layers 151 and 152.

Each of the second, third and fourth cavities 142, 143, and 144 may further include at least one of the first and second dielectric layers 161 and 162 in addition to the first and second etch stop layers 151 and 152. Here, the at least one of the first and second dielectric layers 161 and 162 may be configured to have a total thickness which changes according to the center wavelength for the respective unit filters 111, 112, 113 and 114. FIG. 2 illustrates a case in which the first dielectric layer 161 has a thickness larger than that of the second dielectric layer 162.

Referring to FIG. 2, the second cavity 142 may further include the second dielectric layer 162, and the third cavity 143 may further include the first dielectric layer 161, and the fourth cavity 144 may further include both the first and second dielectric layers 161 and 162. As a result of the inclusion of the plurality of etch stop layers and the different thickness of dielectric layers, among the first to fourth cavities 141 to 144, the first cavity 141 may have the thinnest thickness, and the fourth cavity 144 may have the greatest thickness. In this situation, among the first to fourth unit filters 111 to 114, the first unit filter 111 may have the shortest center wavelength, and the fourth unit filter 114 may have the longest center wavelength.

Each of the first and second etch stop layers 151 and 152 may be layers introduced to facilitate formation of the first to fourth cavities 141 to 144 having different thicknesses, and may include a material having etch selectivity different than that of the first and second dielectric layers 161 and 162, as described later.

The first and second etch stop layers 151 and 152 may include materials having optical characteristics similar to those of the first and second dielectric layers 161 and 162. For example, a difference between a refractive index of the materials included in the first and second dielectric layers 161 and 162 and a refractive index of the materials included in the first and second etch stop layers 151 and 152 may be less than or equal to 2.5. However, the disclosure is not limited thereto. More specifically, a difference between the refractive index of the materials included in the first and second dielectric layers 161 and 162 and the refractive index of the materials included in the first and second etch stop layers 151 and 152 may be less than or equal to 1. Properties such as the difference of refractive indices and the difference of etch selectivity may be considered so that optical losses between layers become minimized.

For example, the first and second dielectric layers 161 and 162 may include silicon, a silicon oxide or a silicon nitride, and the first and second etch stop layers 151 and 152 may include a silicon oxide, a titanium oxide, or a hafnium oxide. However, the disclosure is not limited thereto.

In particular, the first and second dielectric layers 161 and 162 may include a silicon nitride, and the first and second etch stop layers 151 and 152 may include a hafnium oxide. The first and second dielectric layers 161 and 162 may include a silicon nitride, and the first and second etch stop layers 151 and 152 may include a titanium oxide. The first and second dielectric layers 161 and 162 may include a silicon oxide, and the first and second etch stop layers 151 and 152 may include a hafnium oxide. The first and second dielectric layers 161 and 162 may include a silicon oxide, and the first and second etch stop layers 151 and 152 may include a titanium oxide. The first and second dielectric layers 161 and 162 may include silicon, and the first and second etch stop layers 151 and 152 may include a silicon oxide.

FIGS. 3A to 3E are diagrams for explaining an example of a method of manufacturing the spectral filter 1100 of FIG. 2.

Figure 3A:
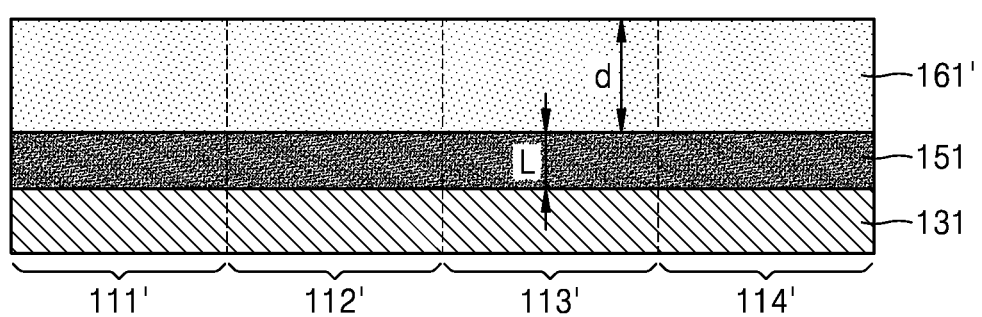
FIGS. 3A to 3E are diagrams for explaining a method of manufacturing a spectral filter according to an example embodiment.

Referring to FIG. 3A, the first etch stop layer 151 is deposited on the lower metal reflective layer 131 by a thickness L, and then a first dielectric layer 161' is deposited thereon by a thickness d. First to fourth areas 111' to 114' of FIG. 3A represent areas where the first to fourth unit filters 111 to 114 are to be formed.

As described above, the first etch stop layer 151 may include a material having etch selectivity different than that of the first dielectric layer 161'. For example, a difference between a refractive index of the material included in the first dielectric layer 161' and a refractive index of the material included in the first etch stop layer 151 may be less than or equal to 2.5. For example, the first dielectric layer 161' may include silicon, a silicon oxide or a silicon nitride, and the first etch stop layer 151 may include a silicon oxide, a titanium oxide, or a hafnium oxide. The etch selectivity between the first dielectric layer and the etch stop may differ by a factor of 5 or more. As an example, HfO2 may be used as the etch stop and SiN may be used as the dielectric layer. The refractive index difference between the two materials is relatively small, and the etch selectivity difference is relatively large. The etch selectivity may differ by a factor of 10 or more. The difference in etch selectivity may vary based on which etch technique, such as wet or dry etching, is used. Characteristics of the difference in etch selectivity between etch stop layer materials and dielectric layer materials may also apply to other example embodiments described herein.

Figure 3B:
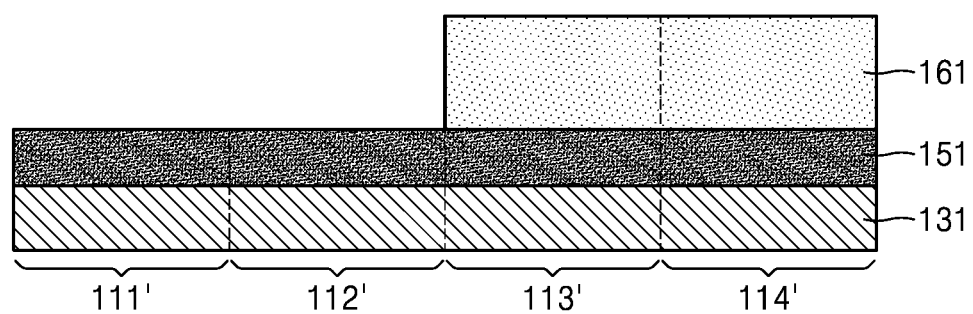

Referring to FIG. 3B, a patterning process including a photolithography process and an etching process may be performed on the first dielectric layer 161'. Accordingly, a patterned first dielectric layer 161 may be formed by removing a part of the first dielectric layer 161' by etching. The etching of the first dielectric layer 161' may be performed through, for example, a dry etch process, but the disclosure is not limited thereto. FIG. 3B illustrates a case in which the patterned first dielectric layer 161 is formed in the third and fourth areas 113' and 114' by removing the first dielectric layer 161' in the first and second areas 111' and 112'. The first etch stop layer 151 in the first and second areas 111' and 112' may be exposed to the outside due to the etching of the first dielectric layer 161'.

Figure 3C:
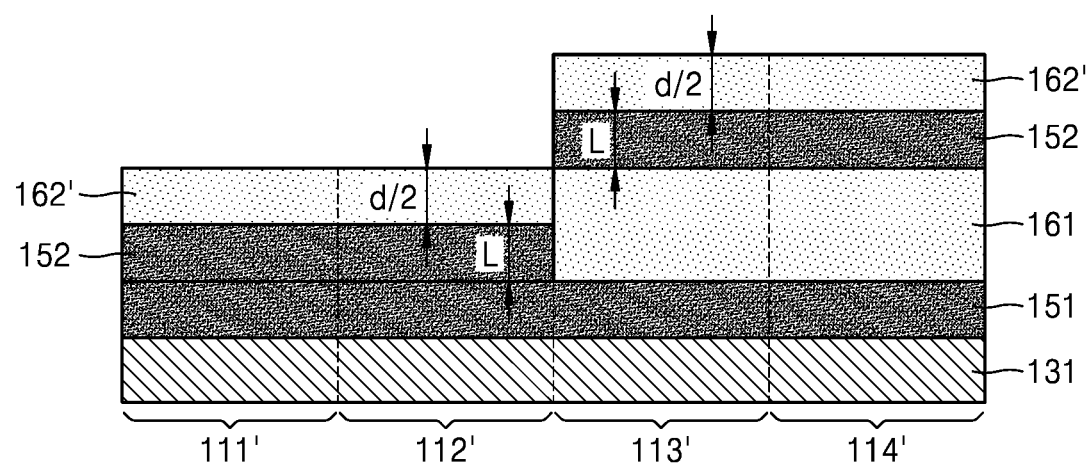

Referring to FIG. 3C, the second etch stop layer 152 may be deposited on the first etch stop layer 151 in the first and second areas 111' and 112', and on the first dielectric layer 161 in the third and fourth areas 113' and 114', respectively by a thickness L, and then the second dielectric layer 162' may be deposited on the second etch stop layer 152 by a thickness d/2.

As described above, the second etch stop layer 152 may include a material having etch selectivity different than that of the second dielectric layer 162'. For example, a difference between a refractive index of the material included in the second dielectric layer 162' and a refractive index of the material included in the second etch stop layer 152 may be less than or equal to 2.5. The second etch stop layer 152 may include the same material as in the first etch stop layer 151, but the disclosure is not limited thereto. The second dielectric layer 162' may include the same material as in the first dielectric layer 161', but the disclosure is not limited thereto.

Figure 3D:
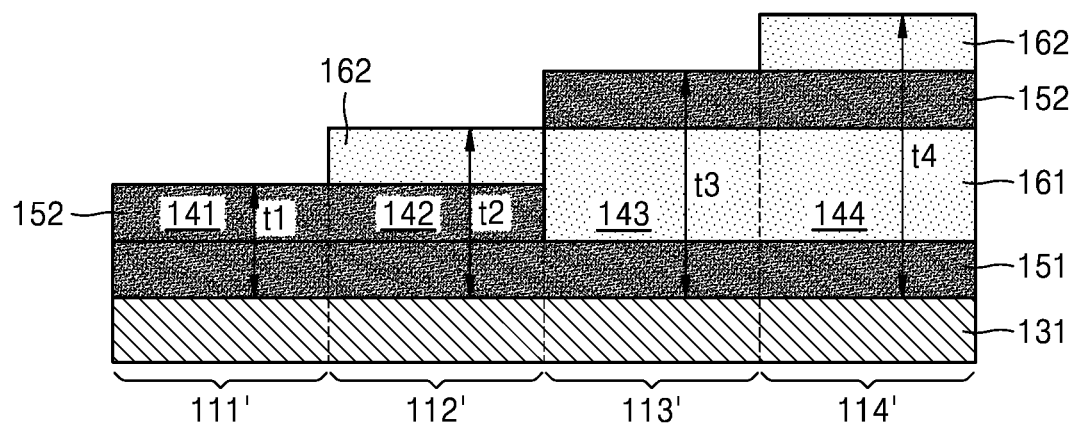

Referring to FIG. 3D, a patterning process including a photolithography process and an etching process may be performed on the second dielectric layer 162'. Accordingly, a patterned second dielectric layer 162 may be formed by removing a part of the second dielectric layer 162' by etching. FIG. 3D illustrates a case in which the patterned second dielectric layer 162 is formed in the second and fourth areas 112' and 114' by removing the second dielectric layer 162' in the first and third areas 111' and 113'. The second etch stop layer 152 in the first and third areas 111' and 113' may be exposed to the outside due to the etching of the second dielectric layer 162'.

Accordingly, the first, second, third, and fourth cavities 141, 142, 143, and 144 having different thicknesses may be formed in the first, second, third, and fourth areas 111', 112', 113', and 114'. Specifically, a thickness t1 of the first cavity 141 may be 2L, a thickness t2 of the second cavity 142 may be 2L+d/2, a thickness t3 of the third cavity 143 may be is 2L+d, and a thickness t4 of the fourth cavity 144 may be 2L+3d/2.

Figure 3E:
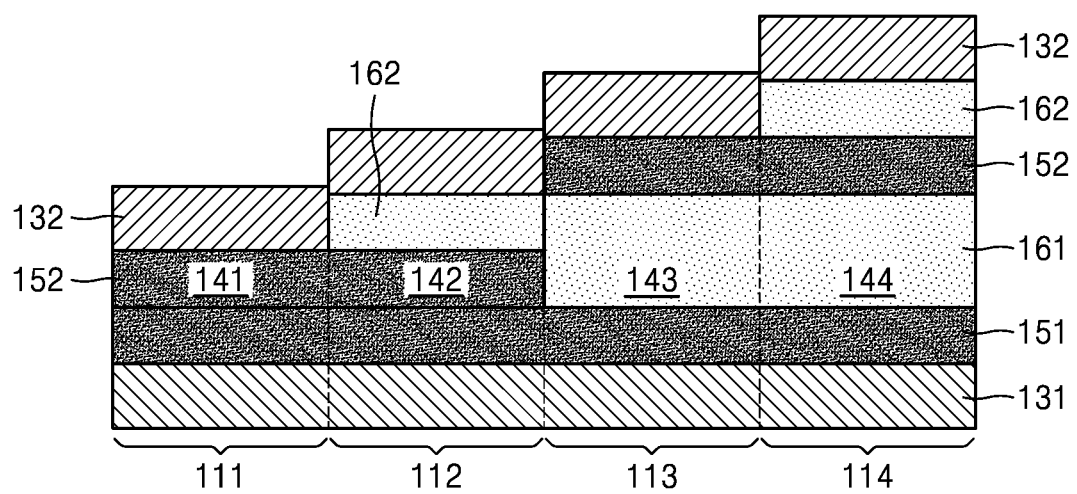

Referring to FIG. 3E, by forming the upper metal reflective layer 132 on the first to fourth cavities 141 to 144 having different thicknesses, the first to fourth unit filters 111 to 114 may be completed.

FIGS. 4A to 4E are diagrams for explaining another example of a method of manufacturing the spectral filter 1100 of FIG. 2.

Figure 4A:
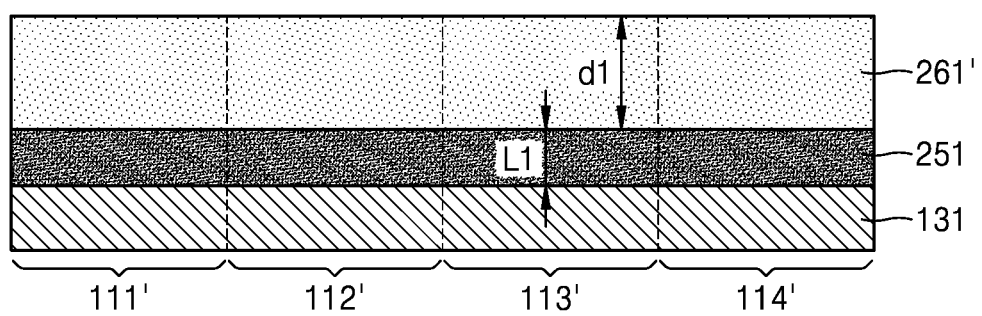
FIGS. 4A to 4E are diagrams for explaining a method of manufacturing a spectral filter according to another example embodiment.

Referring to FIG. 4A, a first etch stop layer 251 is deposited on the lower metal reflective layer 131 by a thickness L1, and then a first dielectric layer 261' is deposited thereon by a thickness d1.

Figure 4B:
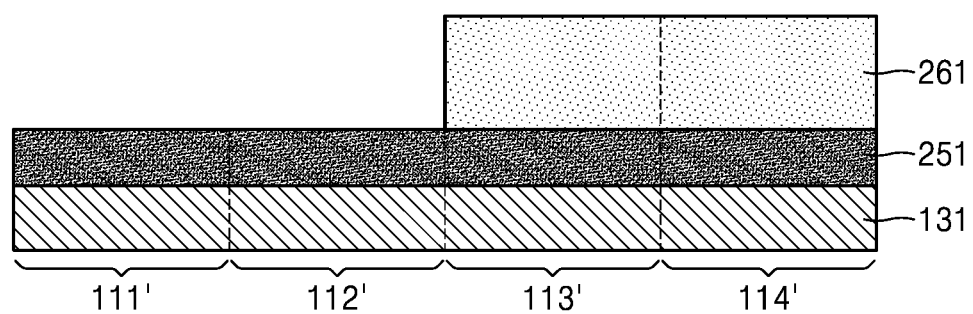

Referring to FIG. 4B, a patterning process including a photolithography process and an etching process may be performed on the first dielectric layer 261'. Accordingly, a patterned first dielectric layer 261 may be formed by removing a part of the first dielectric layer 261' by etching. FIG. 4B illustrates a case in which the patterned first dielectric layer 261 is formed in third and fourth areas 113' and 114' by removing the first dielectric layer 261' in first and second areas 111' and 112'.

Figure 4C:
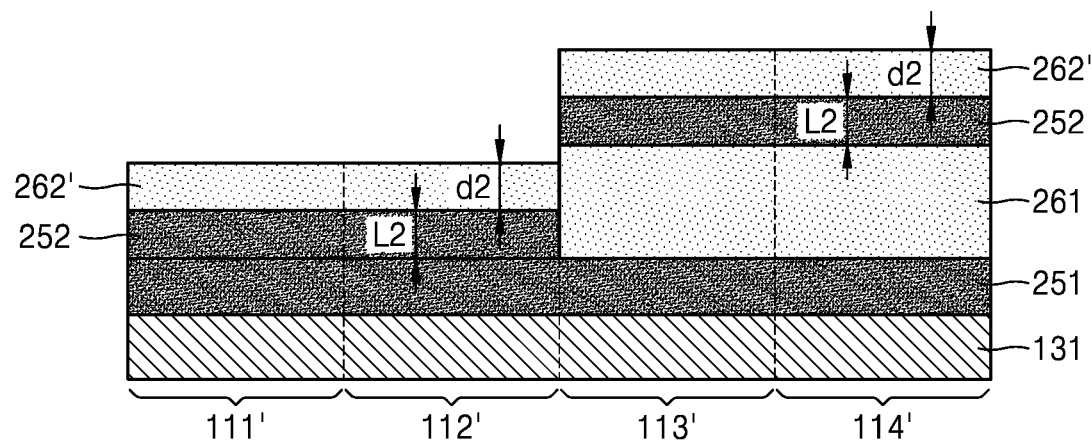

Referring to FIG. 4C, a second etch stop layer 252 may be deposited on the first etch stop layer 251 in the first and second areas 111' and 112', and the first dielectric layer 261 in the third and fourth areas 113' and 114', respectively by a thickness L2, and then a second dielectric layer 262' may be deposited thereon by a thickness d2 (<d1). The second etch stop layer 252 may include a material having etch selectivity different than that of the second dielectric layer 262'.

Figure 4D:
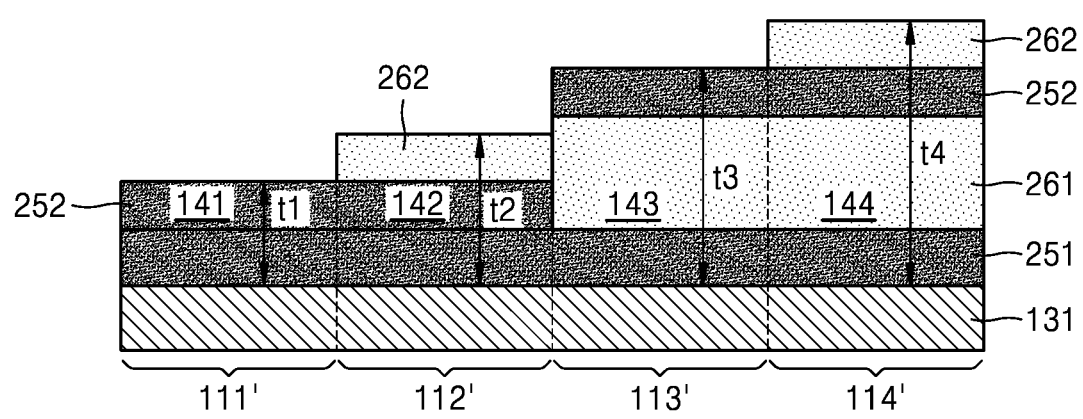

Referring to FIG. 4D, a patterning process including a photolithography process and an etching process may be performed on the second dielectric layer 262'. Accordingly, a patterned second dielectric layer 262 may be formed by removing a part of the second dielectric layer 262' by etching. FIG. 4D illustrates a case in which the patterned second dielectric layer 262 is formed in the second and fourth areas 112' and 114' by removing the second dielectric layer 262' in the first and third areas 111' and 113'.

Accordingly, the first, second, third, and fourth cavities 141, 142, 143, and 144 having different thicknesses may be formed in the first, second, third, and fourth areas 111', 112', 113', and 114'. Specifically, a thickness t1 of the first cavity 141 may be L1+L2, a thickness t2 of the second cavity 142 may be L1+L2+d2, a thickness t3 of the third cavity 143 may be L1+L2+d1, and a thickness t4 of the fourth cavity 144 may be L1+L2+d1+d2.

Figure 4E:
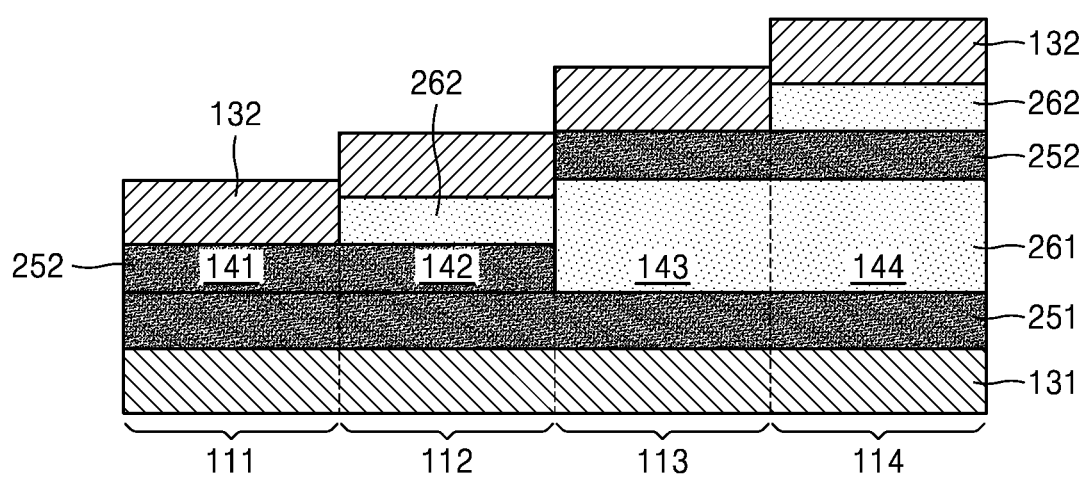

Referring to FIG. 4E, by forming the upper metal reflective layer 132 on the first to fourth cavities 141 to 144 having different thicknesses, the first to fourth unit filters 111 to 114 may be completed. Functionally, the spectral filter may operate in any orientation, and for ease in manufacturing additional optical components that operate with the spectral filter, the formed filter may be inverted to present a top planar surface.

According to the foregoing example embodiments, by forming the cavities 141 to 144 using etch stop layers 151, 152, 251, and 252 having etch selectivities different than those of the dielectric layers 161, 162, 261, and 262, the cavities 141 to 141 may be formed precisely in each desired thickness. The total thickness of the etch stop layers may be 10 to 100 nm, and the total thickness of the dielectric layers may be 10 to 500 nm.

In the above description, the method of forming the four cavities 141 to 144 having different thicknesses is described. One skilled in the art would understand that additional cavity structures of additional thicknesses may be vertically added before forming the top reflective layer 132. The additional cavity structures may be formed by forming a third etch stop layer and a third dielectric layer, in this order, on the second etch stop layers 152 and 252, and the second dielectric layers 162 and 262, respectively. By selectively removing a part of the third dielectric layer through a patterning process, eight cavities having different thicknesses may be formed. Further, a transmittance dielectric layer for improving transmittance may be additionally formed below the lower metal reflective layer 131 and above the upper metal reflective layer 132. The formation of the transmittance dielectric layer will be described later.

In the above description, a case in which the cavities 141 to 144 having different thicknesses are formed on a single metal reflective layer 131 is described. However, first and second filter arrays may also be manufactured by forming cavities having different thicknesses on the first and second metal reflective layers arranged adjacently on a plane, as described later. In such case, at least one spacer may be further formed in at least one of the first and second filter arrays to adjust the thickness of the cavities. Further, the aforementioned cavities having different thicknesses may be formed on a Bragg reflective layer described later, and may be formed on a metal reflective layer and a Bragg reflective layer arranged on a plane.

Figure 5:
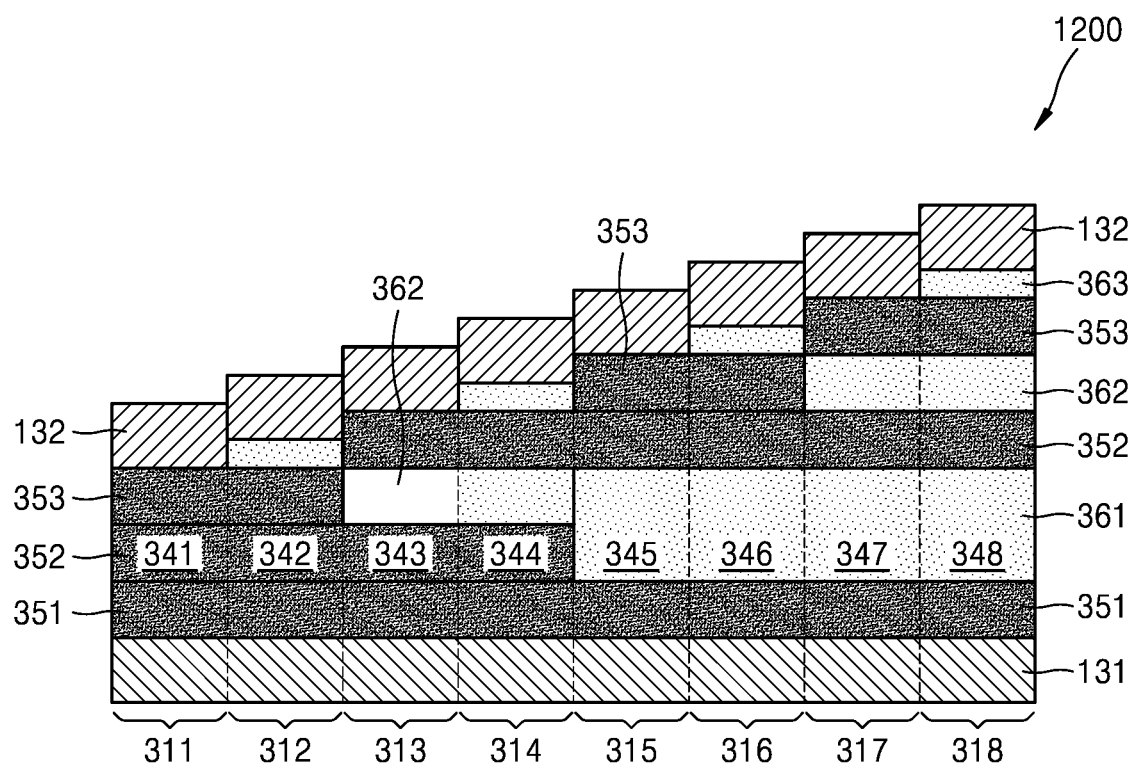
FIG. 5 is a cross-sectional view of a spectral filter according to another example embodiment.

FIG. 5 is a cross-sectional view of a spectral filter 1200 according to another example embodiment. FIG. 5 illustrates the spectral filter 1200 including eight cavities 341 to 348 having different thicknesses.

Referring to FIG. 5, the eight cavities 341 to 348 having different thicknesses according to the center wavelength may be provided between the two metal reflective layers 131 and 132 vertically spaced apart from each other. Here, each of the first to eighth cavities 341 to 348 may include a plurality of etch stop layers 351, 352, and 353 having a constant total thickness. Specifically, each of the first to eighth cavities 341 to 348 may include the first, second, and third etch stop layers 351, 352, and 353.

Each of the second to eighth cavities 342 to 348 may further include at least one of first, second, and third dielectric layers 361, 362, and 363 of which the total thickness changes according to the center wavelength, in addition to the first, second, and third etch stop layers 351, 352, and 353. Here, the first, second, and third etch stop layers 351, 352, and 353 may include materials having etch selectivities different than those of the first, second, and third dielectric layers 361, 362, and 363. For example, a difference between a refractive index of the materials included in the first, second, and third dielectric layers 361, 362, and 363 and a refractive index of material included in the first, second, and third etch stop layers 351, 352, 353 may be less than or equal to 2.5. As previously discussed, the difference in etch selectivity between etch stop layers corresponding dielectric layer may differ by a factor of 5 or more, or by a factor of 10 or more.

FIG. 5 illustrates a case in which the thickness of the first dielectric layer 361 is greater than the sum of the thicknesses of the second and third dielectric layers 362 and 363, and the thickness of the second dielectric layer 362 is greater than the thickness of the third dielectric layer 363. The second cavity 342 may further include the third dielectric layer 363, the third cavity 343 may further include the second dielectric layer 362, the fourth cavity 344 may further include the second and third dielectric layers 362 and 363, the fifth cavity 345 may further include the first dielectric layer 361, the sixth cavity 346 may further include the first and third dielectric layers 361 and 363, the seventh cavity 347 may further include the first and second dielectric layers 361 and 362, and the eighth cavity 348 may further include the first, second, and third dielectric layers 361, 362, and 363. Accordingly, among the first to eighth cavities 341 to 348, the first cavity 341 may have the thinnest thickness, and the eighth cavity 348 may have the greatest thickness.

Figure 6:
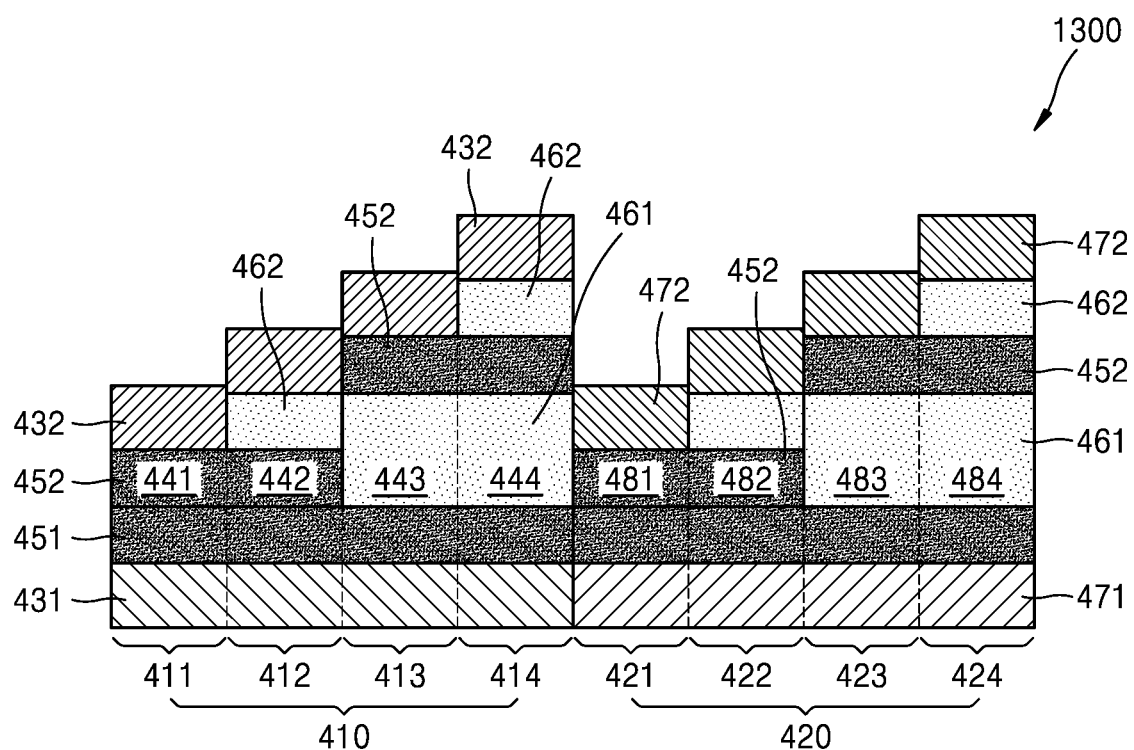
FIG. 6 is a cross-sectional view of a spectral filter according to another example embodiment.

FIG. 6 is a cross-sectional view of a spectral filter 1300 according to another example embodiment.

Referring to FIG. 6, the spectral filter 1300 may include first and second filter arrays 410 and 420 arranged on a plane. Although the first and second filter arrays 410 and 420 may be arranged on substantially the same plane, the disclosure is not limited thereto.

The first filter array 410 may include at least one of first, second, third, and fourth unit filters 411, 412, 413, and 414 having a center wavelength in a first wavelength range. The first wavelength range may be a range of, for example, about 250 nm to about 600 nm. However, this is merely exemplary, and the first wavelength range may also be various wavelength ranges according to a design condition. FIG. 6 illustrates a case in which the first filter array 410 includes four unit filters, e.g., the first, second, third and fourth unit filters 411,412,413, and 414.

The second filter array 420 may include at least one of fifth, sixth, seventh, and eighth unit filter 421, 422, 423, and 424 having a center wavelength in a second wavelength range. The second wavelength range may be longer than the first wavelength range. For example, the second wavelength range may be a range of about 600 nm to about 1100 nm. However, this is merely exemplary, and the second wavelength range may also be various wavelength ranges according to a design condition. FIG. 6 illustrates a case in which the second filter array 420 includes four unit filters, e.g., the fifth, sixth, seventh, and eighth unit filters 421, 422, 423, and 424.

Each of the first, second, third, and fourth unit filters 411, 412, 413, and 414 constituting the first filter array 410 may include the two first metal reflective layers 431 and 432 arranged vertically apart from each other, and the cavities 441, 442, 443, and 444 provided between the first metal reflective layers 431 and 432.

The first metal reflective layers 431 and 432 may include a first metal capable of reflecting light in the first wavelength range. For example, the first metal may include Al, Ag, Au, TiN, and the like. However, the disclosure is not limited thereto. Although the first metal reflective layers 431 and 432 may have a thickness of tens of nanometers, this is merely exemplary.

The first, second, third, and fourth unit filters 411, 412, 413, and 414 may have different center wavelengths in the first wavelength range. To this end, the first, second, third and fourth unit filters 411, 412, 413, and 414 may include first, second, third, and fourth cavities 441, 442, 443, and 444 having different thicknesses.

The first to fourth cavities 441 to 444 may have the same configuration as the first to fourth cavities 141 to 144 in FIG. 2. Each of the first, second, third, and fourth cavities 441, 442, 443, and 444 may include a plurality of etch stop layers 451 and 452 having a constant total thickness. Specifically, each of the first, second, third, and fourth cavities 441, 442, 443, and 444 may include the first and second etch stop layers 451 and 452. Further, the second, third, and fourth cavities 442, 443, and 444 may further include at least one of first and second dielectric layers 461 and 462 of which the total thickness changes according to the center wavelength, in addition to the first and second etch stop layers 451 and 452. FIG. 6 illustrates a case in which the first dielectric layer 461 has a thickness larger than that of the second dielectric layer 462.

The second cavity 442 may further include the second dielectric layer 462, and the third cavity 443 may further include the first dielectric layer 461, and the fourth cavity 444 may further include the first and second dielectric layers 461 and 462. Accordingly, among the first to fourth cavities 441 to 444, the first cavity 441 may have the thinnest thickness, and the fourth cavity 444 may have the greatest thickness. The first and second etch stop layers 451 and 452 may include materials having etch selectivities different than those of the first and second dielectric layers 461 and 462. For example, a difference between a refractive index of the materials included in the first and second dielectric layers 461 and 462 and a refractive index of the materials included in the first and second etch stop layers 451 and 452 may be less than or equal to 2.5.

Each of the fifth, sixth, seventh, and eighth unit filters 421, 422, 423, and 424 constituting the second filter array 420 may include the two second metal reflective layers 471 and 472 arranged vertically apart from each other, and the fifth, sixth, seventh, and eighth cavities 481, 482, 483, and 484 provided between the second metal reflective layers 471 and 472.

The second metal reflective layers 471 and 472 may include a second metal capable of reflecting light in the second wavelength range. For example, the second metal may include Cu, Ag, Au, TiN, and the like. However, the disclosure is not limited thereto. Although the second metal reflective layers 471 and 472 may have a thickness of tens of nanometers, this is merely exemplary.

The second metal constituting the second metal reflective layers 471 and 472 may be a metal different from the first metal constituting the first metal reflective layers 431 and 432 described above. For example, when the first metal reflective layers 431 and 432 include Al, the second metal reflective layers 471 and 472 may include Cu. Furthermore, for example, when the first metal reflective layers 431 and 432 include Al, the second metal reflective layers 471 and 472 may include Ag. Furthermore, for example, when the first metal reflective layers 431 and 432 include Ag, the second metal reflective layers 471 and 472 may include Cu.

The fifth, sixth, seventh, and eighth unit filters 421, 422, 423, and 424 may have different center wavelengths in the second wavelength range. To this end, the fifth, sixth, seventh, and eighth unit filters 421, 422, 423, and 424 may include fifth, sixth, seventh, and eighth cavities 481, 482, 483, and 484 having different thicknesses. Here, the fifth, sixth, seventh, and eighth cavities 481, 482, 483, and 484 may have the same configuration as the first, second, third, and fourth cavities 441, 442, 443, and 444, respectively, described above.

As described above, as the first filter array 410 in which the cavities 441, 442, 443, and 444 having different thicknesses are provided between the first metal reflective layers 431 and 432 and the second filter array 420 in which the cavities 481, 482, 483, and 484 having different thicknesses are provided between the second metal reflective layers 471 and 472 are arranged on a plane, a spectral filter having the characteristics of a broadband including the first wavelength range and the second wavelength range, for example, a wavelength range from ultraviolet to near infrared, may be implemented.

Figure 7:
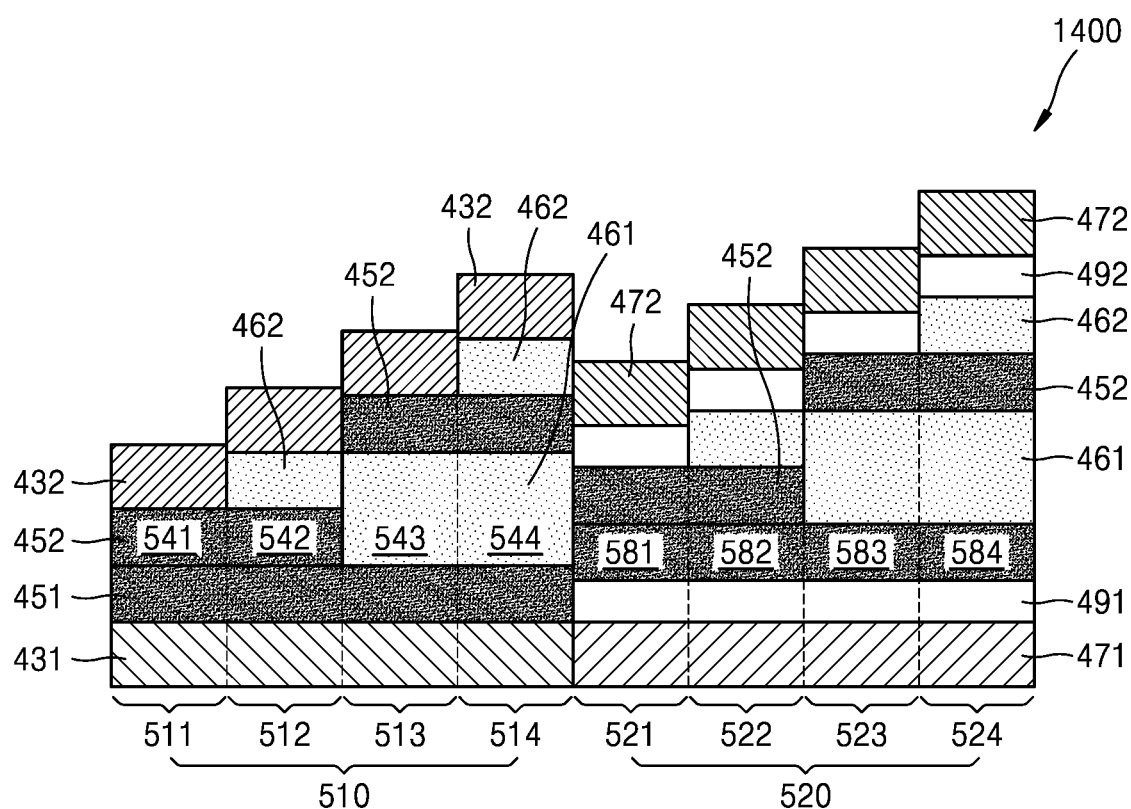
FIG. 7 is a cross-sectional view of a spectral filter according to another example embodiment.

FIG. 7 is a cross-sectional view of a spectral filter 1400 according to another example embodiment. The spectral filter 1400 of FIG. 7 is the same as the spectral filter 1300 of FIG. 6, except that the second filter array 520 further includes first and second spacers 491 and 492 for adjusting thicknesses of the cavities 581, 582, 583, and 584.

Referring to FIG. 7, the spectral filter 1400 may include first and second filter arrays 510 and 520 arranged on a plane. The first filter array 510 may include first, second, third, and fourth unit filters 511, 512, 513, and 514, and the second filter array may include fifth, sixth, seventh, and eighth unit filters 521, 522, 523, and 524.

The first, second, third, and fourth unit filters 511, 512, 513, and 514 may include first, second, third, and fourth cavities 541, 542, 543, and 544 having different thicknesses and provided between the two first metal reflective layers 431 and 432 vertically spaced apart from each other. The first to fourth unit filters 511, 512, 513, and 514 are the same as the first to fourth unit filters 411, 412, 413, and 414 of FIG. 6.

The fifth, sixth, seventh, and eighth unit filters 521, 522, 523, and 524 may include fifth, sixth, seventh, and eighth cavities 581, 582, 583, and 584 having different thicknesses and provided between the two second metal reflective layers 471 and 472 vertically spaced apart from each other.

Each of the fifth, sixth, seventh, and eighth cavities 581, 582, 583, and 584 may include a plurality of etch stop layers 451 and 452 having a constant total thickness. The sixth, seventh, and eighth cavities 582, 583, and 584 may further include at least one of first and second dielectric layers 461 and 462 of which the total thickness changes according to the center wavelength, in addition to the first and second etch stop layers 451 and 452.

Each of the fifth, sixth, seventh, and eighth cavities 581, 582, 583, and 584 may further include at least one of the first and second spacers 491 and 492. Here, the at least one of the first and second spacers 491 and 492 may adjust thicknesses of the fifth, sixth, seventh, and eighth cavities 581, 582, 583, and 584 to allow the fifth, sixth, seventh, and eighth unit filters 521, 522, 523, and 524 to have desired center wavelengths. The first and second spacers 491 and 492 may include a certain dielectric material. For example, the first and second spacers 491 and 492 may include the same material as in the first and second dielectric layers 461 and 462, but the disclosure is not limited thereto.

FIG. 7 illustrates a case in which the first and second spacers 491 and 492 are provided below and above the fifth, sixth, seventh, and eighth cavities 581, 582, 583, and 584. However, the disclosure is not limited thereto, and the spacer may be provided only below the fifth, sixth, seventh, and eighth cavities 581, 582, 583, and 584 or only above the fifth, sixth, seventh, and eighth cavities 581, 582, 583, and 584. The spacer may also be provided inside the fifth, sixth, seventh, and eighth cavities 581, 582, 583, and 584.

Figure 8:
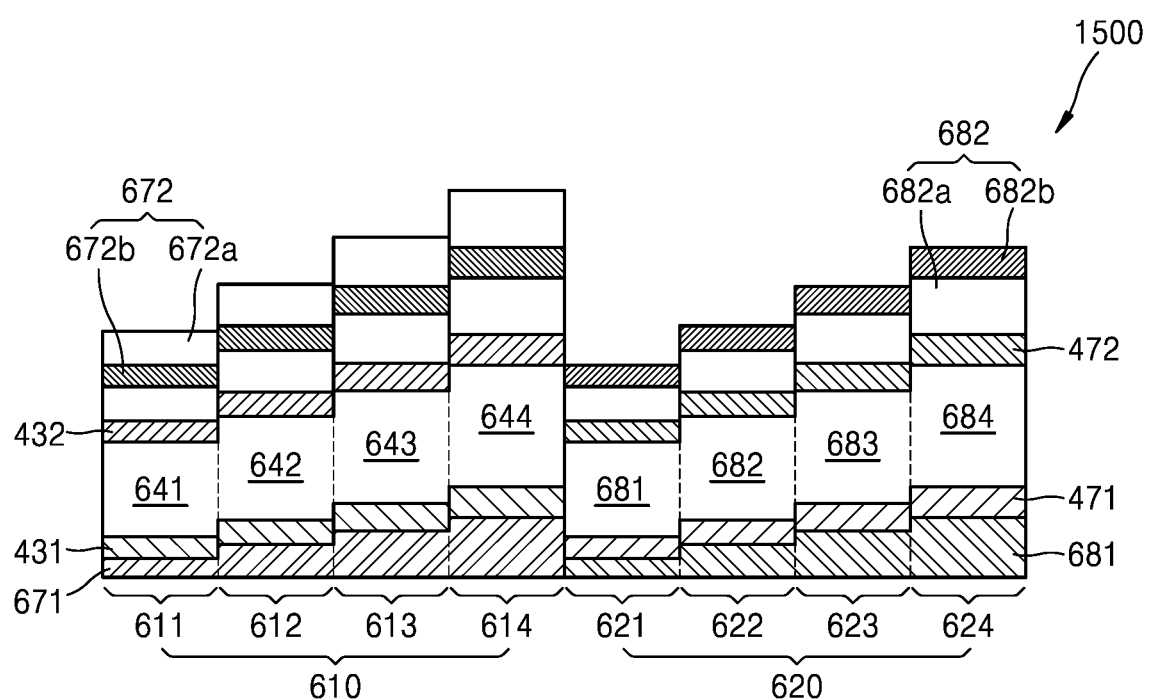
FIG. 8 is a cross-sectional view of a spectral filter according to another example embodiment.

FIG. 8 is a cross-sectional view of a spectral filter 1500 according to another example embodiment. Hereinafter, descriptions will be made focusing on the aspects different from the aforementioned example embodiments.

Referring to FIG. 8, the spectral filter 1500 may include first and second filter arrays 610 and 620 arranged on a plane. The first filter array 610 may include first, second, third, and fourth unit filters 611, 612, 613, and 614, and the second filter array 620 may include fifth, sixth, seventh, and eighth unit filters 621, 622, 623, and 624.

Each of the first, second, third, and fourth unit filters 611, 612, 613, and 614 may include the two first metal reflective layers 631 and 632 (which are the same as 431 and 432) vertically spaced apart from each other, first, second, third, and fourth cavities 641, 642, 643, and 644 provided between the first metal reflective layers, and first and second transmittance dielectric layers 671 and 672 each provided below and above the first, second, third, and fourth cavities 641, 642, 643, and 644. The cavities of 641 to 644 may be the same as the cavity structures 441 to 444. As the first metal reflective layers 631 and 632 and the first to fourth cavities 641, 642, 643, and 644 are as described above, descriptions thereof are omitted.

The first and second transmittance dielectric layers 671 and 672 may improve the transmittance of the first to fourth unit filters 611, 612, 613, and 614. Each of the first and second transmittance dielectric layers 671 and 672 may include a titanium oxide, a silicon nitride, a hafnium oxide, a silicon oxide, a high refractive polymer, and the like, but the disclosure is not limited thereto.

The first and second transmittance dielectric layers 671 and 672 may each include a single layer structure or a multi-layer structure. FIG. 8 illustrates a case in which the first dielectric layer 671 has a single-layer structure, and the second dielectric layer 672 has a three-layer structure. Here, the second dielectric layer 672 may have a structure in which the first and second material layers 672a and 672b, which are different from each other, are alternately stacked.

The thickness of the first and second transmittance dielectric layers 671 and 672 may change according to the center wavelength. FIG. 8 illustrates a case in which the thicknesses of the first and second transmittance dielectric layers 671 and 672 increase as the center wavelengths of the first, second, third, and fourth unit filters 611, 612, 613, and 614 increase.

Each of the fifth, sixth, seventh, and eighth unit filters 621, 622, 623, and 624 may include the two second metal reflective layers 471 and 472 vertically spaced apart from each other, the fifth, sixth, seventh, and eighth cavities 681, 682, 683, and 684 provided between the second metal reflective layers 471 and 472, and third and fourth dielectric layers 681 and 682 provided below and above the fifth, sixth, seventh, and eighth cavities 681, 682, 683, and 684. The cavities of 681 to 684 are the same as the cavity structures of 481 to 484, described above. As the second metal reflective layers 471 and 472 and the fifth to eighth cavities 681, 682, 643, and 684 are as described above, descriptions thereof are omitted.

The third and fourth dielectric layers 681 and 682 may improve the transmittance of the fifth to eighth unit filters 621, 622, 623, and 624, like the first and second transmittance dielectric layers 671 and 672. Each of the third and fourth dielectric layers 681 and 682 may include a titanium oxide, a silicon nitride, a hafnium oxide, a silicon oxide, a high refractive polymer, and the like, but the disclosure is not limited thereto.

Each of the third and fourth dielectric layers 681 and 682 may include a single-layer structure or a multi-layer structure. FIG. 8 illustrate a case in which the third dielectric layer 681 has a single-layer structure, and the fourth dielectric layer 682 has a two-layer structure. Here, the fourth dielectric layer 682 may have a structure in which the first and second material layers 682a and 682b, which are different from each other, are alternately stacked.

The thickness of the third and fourth dielectric layers 681 and 682 may change according to the center wavelength. FIG. 8 illustrates a case in which the thicknesses of the third and fourth dielectric layers 681 and 682 increase as the center wavelengths of the fifth, sixth, seventh, and eighth unit filters 621, 622, 623, and 624 increase.

Figure 9:
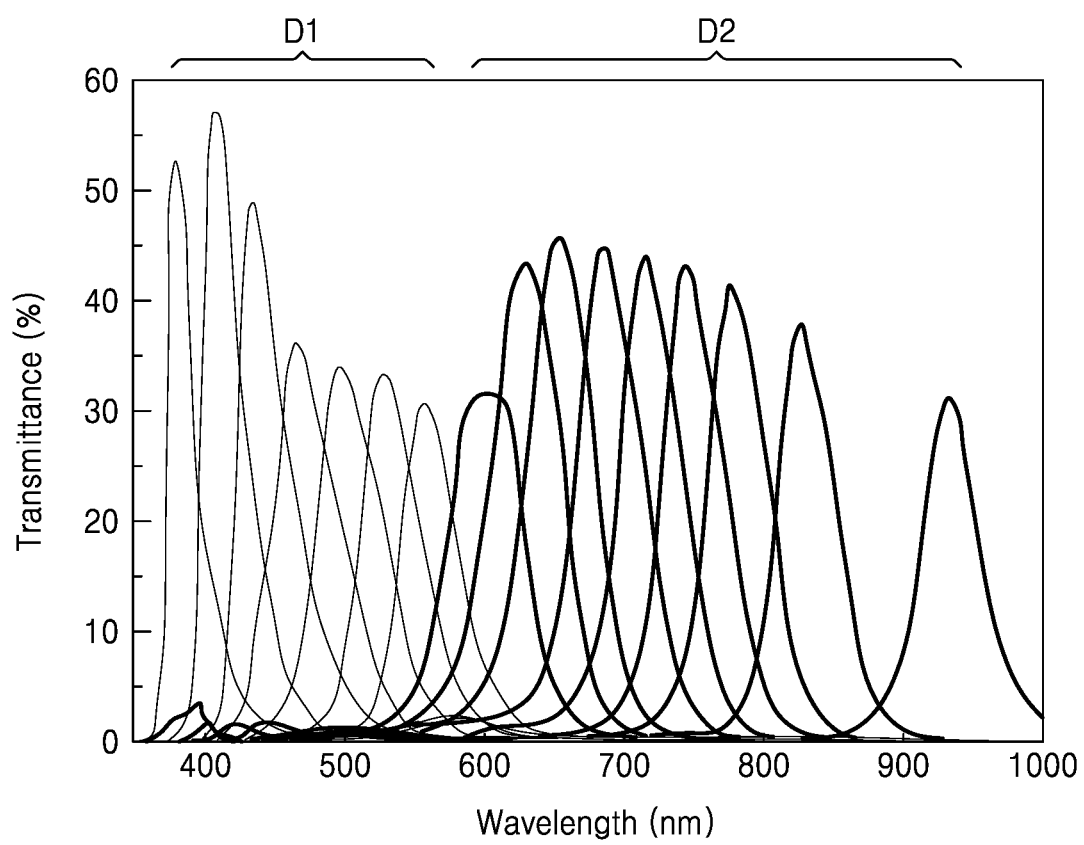
FIG. 9 is a graph of transmittance spectrums of the spectral filter of FIG. 8, but having a first filter array of unit filters corresponding to seven center wavelengths and a second filter array of unit filters corresponding to nine center wavelengths.

FIG. 9 is a graph of transmittance spectrums of the spectral filter similar to the filter 1500 of FIG. 8. Whereas FIG. 8 illustrates the filter arrays 610 and 620 each include four filter units, FIG. 9 illustrates transmittance spectrums in a case in which, in the spectral filter 1500 of FIG. 8 is formed such that the first filter array 610 includes seven unit filters having different center wavelengths, and the second filter array 620 includes nine unit filters having different center wavelengths.

The first metal reflective layers 431 and 432 include Al, and the second metal reflective layers 471 and 472 include Cu, and cavities 641 to 644 and 681 to 684 include $TiO_2$ (etch stop layer) and SiN (dielectric layer). Each of the first and third dielectric layers 671 and 681 includes SiN, and each of the second and fourth dielectric layers 672 and 682 may include a multi-layer film of $TiO_2$ and SiN. In FIG. 9, "D1" denotes transmittance spectrums of the first filter array 610, and "D2" denotes transmittance spectrums of the second filter array 620. Referring to FIG. 9, it may be seen that the spectral filter 1500 implements broadband characteristics and high transmittance.

Figure 10:
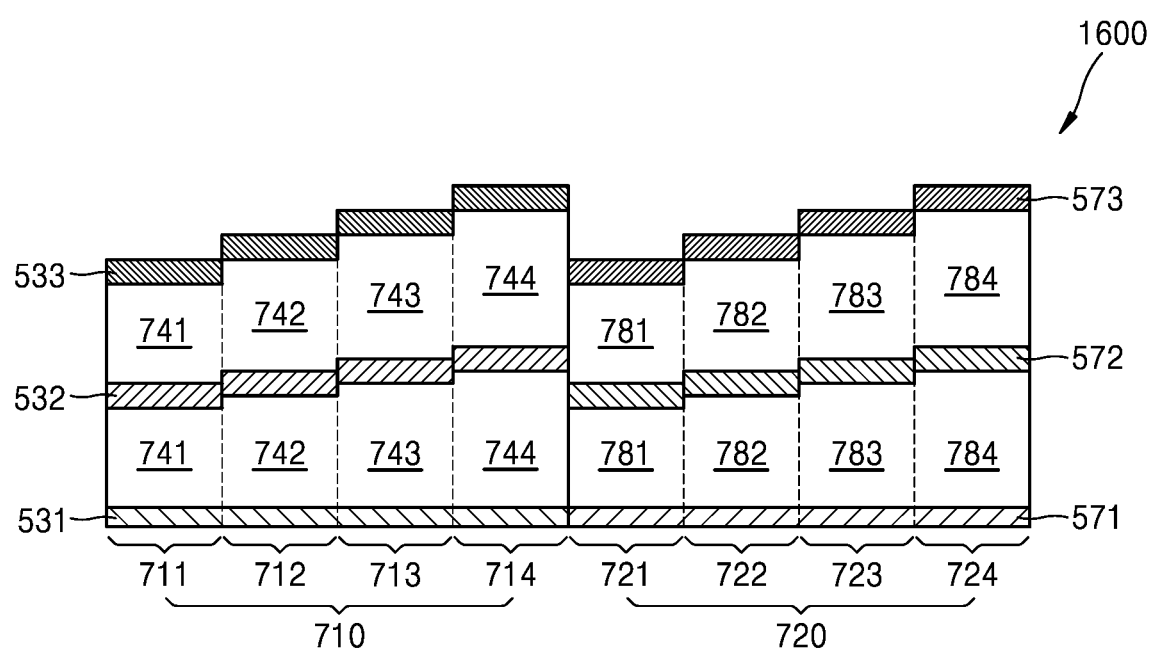
FIG. 10 is a cross-sectional view of a spectral filter according to another example embodiment.

FIG. 10 is a cross-sectional view of a spectral filter 1600 according to another example embodiment. In FIG. 10, each of first to eighth unit filters 711 to 714 and 721 to 724 constituting the spectral filter 1600 may have a multi-cavity structure.

Referring to FIG. 10, the first filter array 710 may include the first, second, third, and fourth unit filters 711, 712, 713, and 714, and the second filter array 720 may include the fifth, sixth, seventh, and eighth unit filters 721, 722, 723, and 724.

Each of the first, second, third, and fourth unit filters 711, 712, 713, and 714 may include three first metal reflective layers 531, 532, and 533 spaced apart from each other, and two cavities 741, 742, 743, and 744 provided between the first metal reflective layers 531, 532, and 533. Here, as the first metal reflective layers 531, 532, and 533, and the cavities 741, 742, 743, and 744 having different thicknesses may include the structures as described previously in example embodiments, descriptions thereof are omitted. The central reflective layer 532 is common to the cavities above and below the layer 532. The central reflective layer 532 forms a resonator, forming a resonator pair with the lower reflective layer 531, and another resonator pair with the upper reflective layer 533. The central metal reflective layer 532 may be thicker than the upper or lower reflective layers 531 and 533.

Each of the fifth, sixth, seventh, and eighth unit filters 721, 722, 723, and 724 may include three second metal reflective layers 571, 572, and 573 spaced apart from each other, and two cavities 781, 782, 783, and 784 provided between the second metal reflective layers 571, 572, and 573. Here, as the second metal reflective layers 571, 572, and 573, and the cavities 781, 782, 783, and 784 having different thicknesses may include the structures as described in previous example embodiments, descriptions thereof are omitted.

Although each of the unit filters 711 to 714 and 721 to 724 is described above as including two stacked cavities 741, 742, 743, 744 and 781, 782, 783, and 784, this is merely an example, and each of the unit filters 711 to 714 and 721 to 724 may include three or more stacked cavities.

Figure 11:
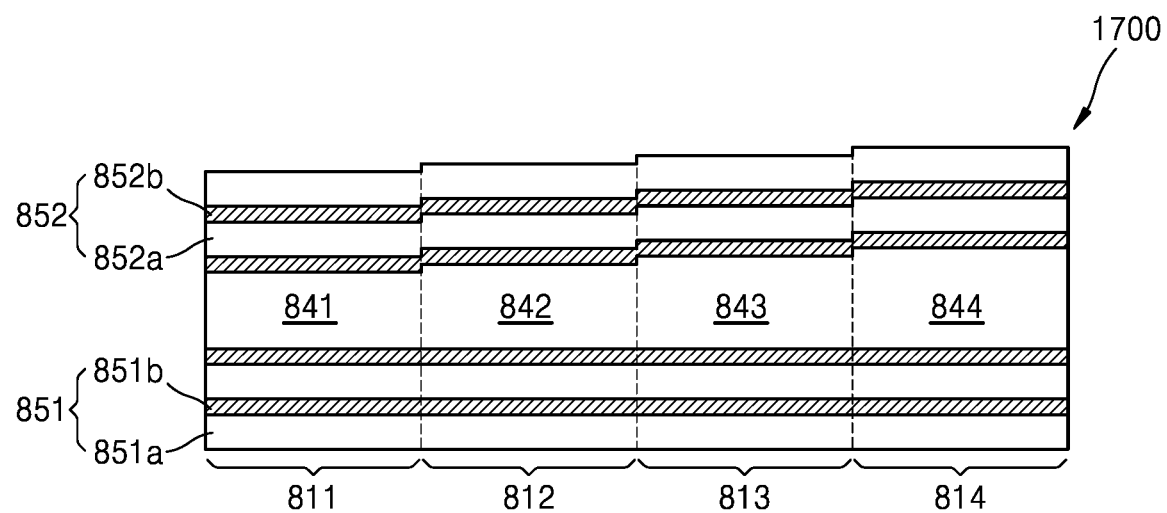
FIG. 11 is a cross-sectional view of a spectral filter according to another example embodiment.

FIG. 11 is a cross-sectional view of a spectral filter 1700 according to another example embodiment.

Referring to FIG. 11, the spectral filter 1700 may include a plurality of unit filters 811, 812, 813, and 814, which are arranged in a two dimensional manner on a plane. FIG. 11 illustrates an example of four unit filters, e.g., the first, second, third and fourth unit filters 811, 812, 813, and 814.

Each of the first, second, third, and fourth unit filters 811, 812, 813, and 814 may transmit light having a specific center wavelength, and have a Fabry-Perot structure in which cavities 841, 842, 843, and 844 are provided between two Bragg reflective layers 851 and 852 vertically spaced apart from each other.

When light is incident on the cavities 841, 842, 843, and 844 by transmitting through at least one of the Bragg reflective layers 851 and 852, the light may reciprocate between the Bragg reflective layers 851 and 852 inside the cavities 841, 842, 843, and 844 during which a constructive interference and a destructive interference occur. Light having a specific center wavelength and satisfying a constructive interference condition may exit to the outside of each of the first, second, and third unit filters 811, 812, 813, and 814. The wavelength band and the center wavelength of the light passing through the unit filters 811, 812, 813, and 814 may be determined according to a reflection band of the Bragg reflective layers 851 and 852 and the characteristics of the cavities 841, 842, 843, and 844.

As specific configuration of the first, second, third, and fourth cavities 841, 842, 843, and 844 having different thicknesses is as described in the foregoing example embodiments, descriptions thereof are omitted.

Each of the Bragg reflective layers 851 and 852 may have a structure in which the first material layers 851a and 852a having different refractive indexes and the second material layers 851b and 852b are alternately stacked. For example, the first material layers 851a and 852a and the second material layers 851b and 852b may include a silicon oxide and a titanium oxide. For another example, the first material layers 851a and 852a and the second material layers 851b and 852b may include a silicon oxide and silicon. However, this is merely an example, and the first material layers 851a and 852a and the second material layers 851b and 852b may include various other materials.

Figure 12:
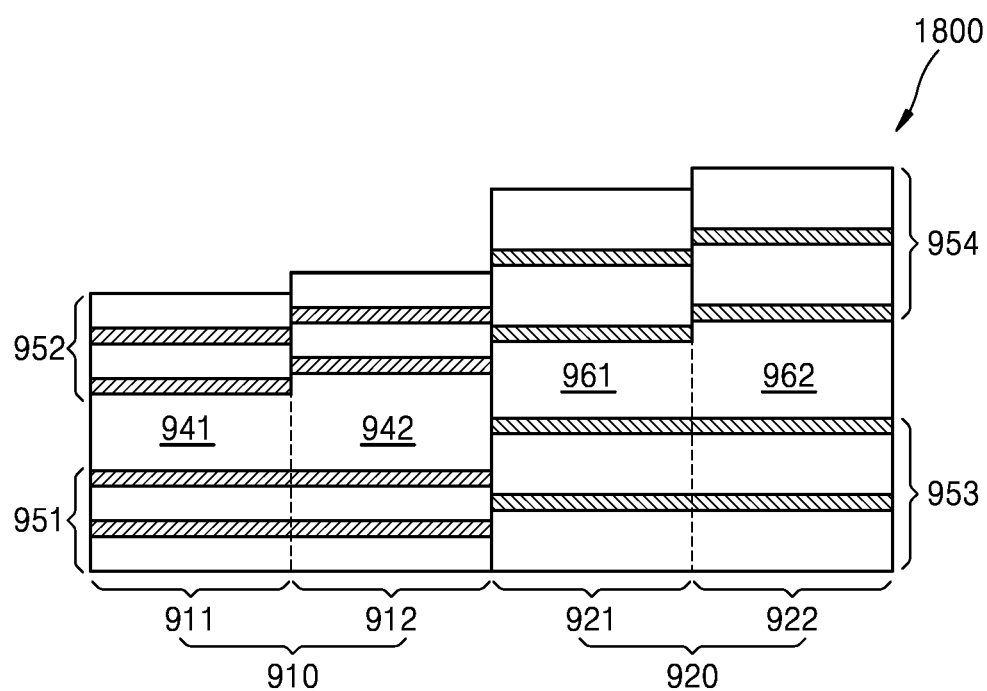
FIG. 12 is a cross-sectional view of a spectral filter according to another example embodiment.

FIG. 12 is a cross-sectional view of a spectral filter 1800 according to another example embodiment.

Referring to FIG. 12, the spectral filter 1800 may include first and second filter arrays 910 and 920 arranged on a plane. The first filter array 910 may include at least one of first and second unit filters 912 and 912 having a center wavelength in a first wavelength range. FIG. 12 illustrates a case in which the first filter array 910 includes two unit filters, e.g., the first and second unit filters 911 and 912.

Each of the first and second unit filters 911 and 912 may include two first Bragg reflective layers 951 and 952 vertically spaced apart from each other, and cavities 941 and 942 provided between the first Bragg reflective layers 951 and 952. Here, the first Bragg reflective layers 951 and 952 may have a structure in which material layers having different refractive indexes are alternately stacked. The first and second cavities 941 and 942 may have different thicknesses, and as specific configurations of such cavities are described above, descriptions thereof are omitted.

Figure 13:
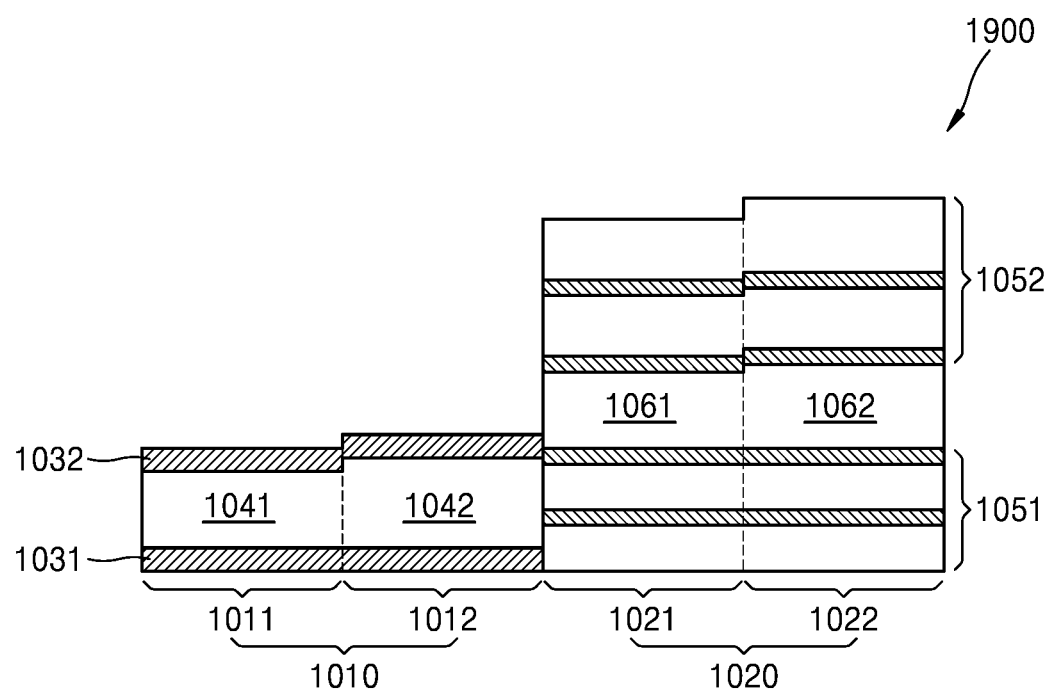
FIG. 13 is a cross-sectional view of a spectral filter according to another example embodiment.

The second filter array 920 may include at least one of third and fourth unit filters 921 and 922 having a center wavelength in a second wavelength range. FIG. 13 illustrates a case in which the second filter array 920 includes two unit filters, e.g., the third and fourth unit filters 921 and 922.

Each of the third and fourth unit filters 921 and 922 may include two second Bragg reflective layers 953 and 954 vertically spaced apart from each other, and cavities 961 and 962 provided between the second Bragg reflective layers 953 and 954. Here, the second Bragg reflective layers 953 and 954 may have a structure in which material layers having different refractive indexes are alternately stacked. The material layers constituting the second Bragg reflective layers 953 and 954 may be different from the material layers constituting the first Bragg reflective layers 951 and 952 in at least one of thickness and quality of material. The third and fourth cavities 961 and 962 may have different thicknesses, and as specific configurations of such cavities are described above, descriptions thereof are omitted.

Meanwhile, although each of the unit filters 911, 912, 921, and 922 is described above as including a single-cavity structure, the disclosure is not limited thereto, and each of the unit filters 911, 912, 921, and 922 may have a multi-cavity structure.

FIG. 13 is a cross-sectional view of a spectral filter 1900 according to another example embodiment.

Referring to FIG. 13, the spectral filter 1900 may include first and second filter arrays 1010 and 1020 arranged on a plane. The first filter array 1010 may include at least one of first and second unit filters 1011 and 1012 having a center wavelength in a first wavelength range. FIG. 13 illustrates a case in which the first filter array 1010 includes two unit filters, e.g., the first and second unit filters 1011 and 1012.

Each of the first and second unit filters 1011 and 1012 may include two metal reflective layers 1031 and 1032 vertically spaced apart from each other, and cavities 1041 and 1042 provided between the metal reflective layers 1031 and 1032. As the metal reflective layers 1031 and 1032 and the first and second cavities 1041 and 1042 having different thicknesses are as described above, descriptions thereof are omitted.

Figure 14:
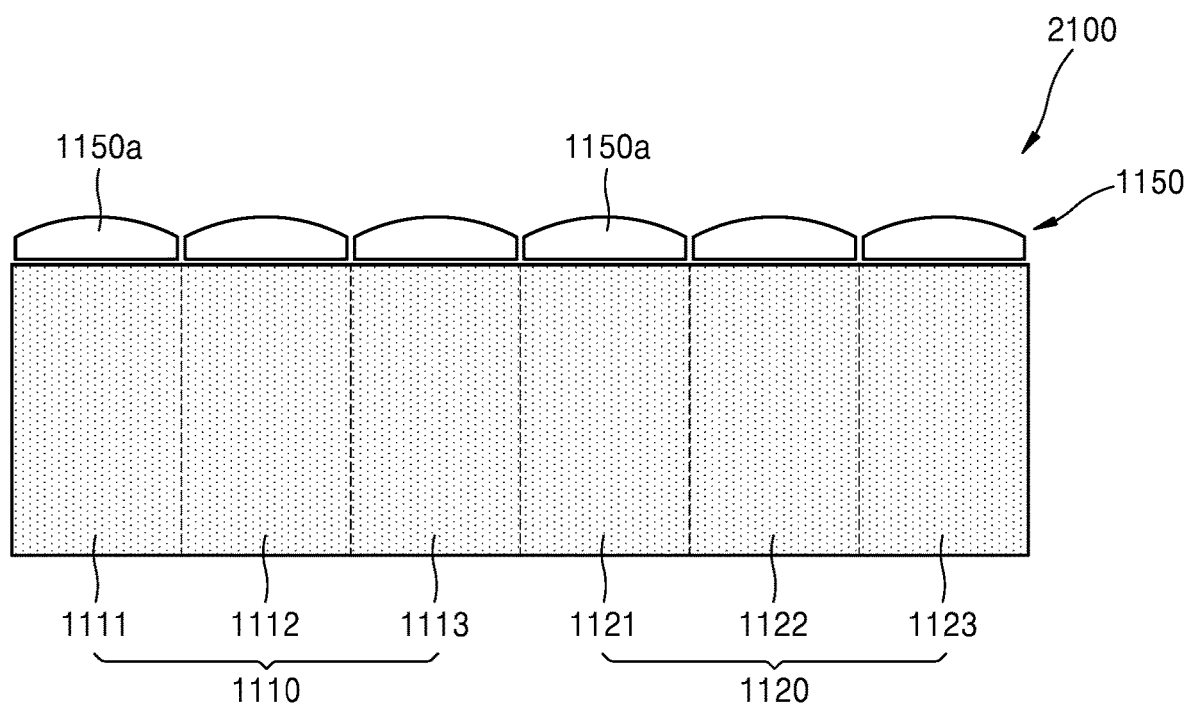
FIG. 14 is a cross-sectional view of a spectral filter according to another example embodiment.

The second filter array 1020 may include at least one of third and fourth unit filters 1021 and 1022 having a center wavelength in a second wavelength range. FIG. 14 illustrates a case in which the second filter array 1020 includes two unit filters, e.g., the third and fourth unit filters 1021 and 1022.

Each of the third and fourth unit filters 1021 and 1022 may include two Bragg reflective layers 1051 and 1052 vertically spaced apart from each other, and cavities 1061 and 1062 provided between the Bragg reflective layers 1051 and 1052. As the Bragg reflective layers 1051 and 1052 and the third and fourth cavities 1061 and 1062 having different thicknesses are as described above, descriptions thereof are omitted.

FIG. 14 is a cross-sectional view of a spectral filter 2100 according to another example embodiment.

Referring to FIG. 14, the spectral filter 2100 may include first and second filter arrays 1110 and 1120 and a microlens array 1150 provided above the first and second filter arrays 1110 and 1120. FIG. 14 illustrates a case in which the first filter array 1110 includes first, second, and third unit filters 1111, 1112, and 1113, and the second filter array 1120 may include fourth, fifth, and sixth unit filters 1121, 1122, and 1123 for convenience sake.

The first filter array 1110 may be any one of the first filter arrays 410, 510, 610, 710, 910, and 1010 described above, and the second filter array 1120 may be any one of the second filter arrays 420, 520, 620, 720, 920, and 1020 described above. The descriptions of the first and second filter arrays 1110 and 1120 are omitted.

The microlens array 1150 having a plurality of microlenses 1150a may be provided above the first and second filter arrays 1110 and 1120. The microlenses 1150a may serve to focus external light to be incident on appropriate first to sixth unit filters 1111, 1112, 1113, 1121, 1122, and 1123.

FIG. 14 illustrates a case in which the microlenses 1150a are provided to have a one-to-one correspondence to the first to sixth unit filters 1111, 1112, 1113, 1121, 1122, and 1123. However, this is merely exemplary, and at least two of the first to sixth unit filters 1111, 1112, 1113, 1121, 1122, and 1123 may be provided corresponding to one microlens 1150a.

Figure 15:
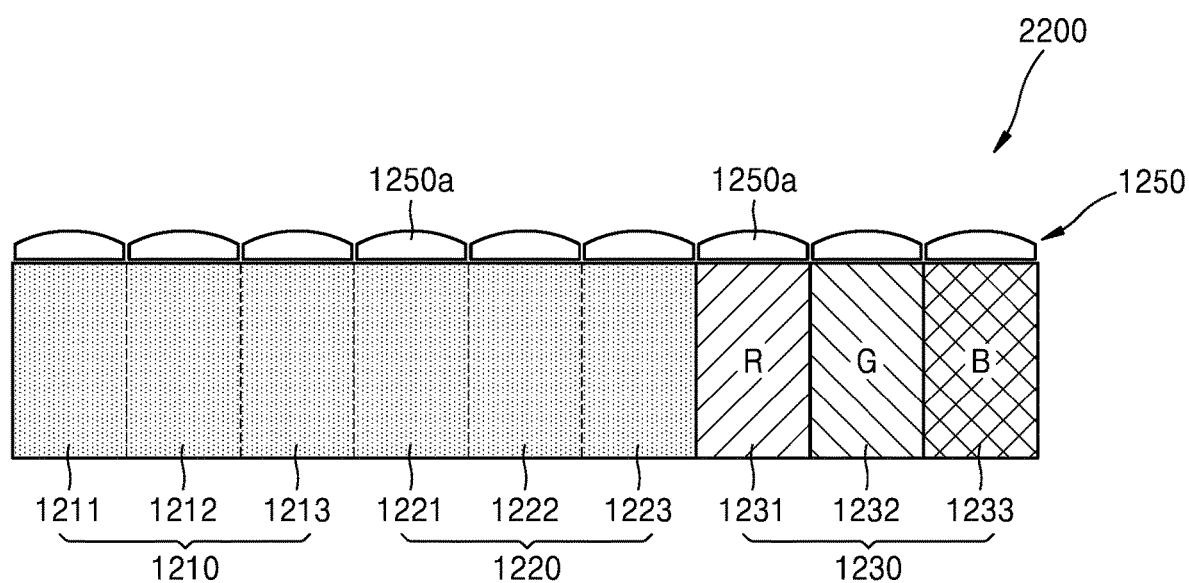
FIG. 15 is a cross-sectional view of a spectral filter according to another example embodiment.

FIG. 15 is a schematic cross-sectional view of a spectral filter 2200 according to another example embodiment.

Referring to FIG. 15, the spectral filter 2200 may include first and second filter arrays 1210 and 1220 and a color filter array 1230. The first and second filter arrays 1210 and 1220 and the color filter array 1230 may be arranged on substantially the same plane.

FIG. 15 illustrates a case in which the first filter array 1210 includes first, second, and third unit filters 1211, 1212, and 1213, and the second filter array 1220 may include fourth, fifth, and sixth unit filters 1221, 1222, and 1223 for convenience sake. The first filter array 1210 may be any one of the first filter arrays 410, 510, 610, 710, 910, and 1010 described above, and the second filter array 1220 may be any one of the second filter arrays 420, 520, 620, 720, 920, and 1020 described above. The descriptions of the first and second filter arrays 1210 and 1220 are omitted.

The color filter array 1230 may include, for example, a red color filter 1231, a green color filter 1232, and a blue color filter 1233. The red color filter 1231 may transmit red light having a wavelength band of about 600 nm to about 700 nm, the green color filter 1232 may transmit green light having a wavelength band of about 500 nm to about 600 nm, and the blue color filter 1233 may transmit blue light having a wavelength band of about 400 nm to about 500 nm. For example, typical color filters applied to color display apparatuses such as liquid crystal display apparatuses, organic light-emitting display apparatuses, and the like may be used as the red, green and blue color filters 1231, 1232, and 1233. A microlens array 1250 including a plurality of microlenses 1250a may be further provided above the first and second filter arrays 1210 and 1220 and the color filter array 1230.

According to an example embodiment, not only information about center wavelengths of the unit filters 1211, 1212, 1213, 1221, 1222, and 1223 may be obtained by using the first and second filter arrays 1210 and 1220, but also information about wavelengths of the red, green, and blue light may be additionally obtained by using the color filter array 1230.

Figure 16:
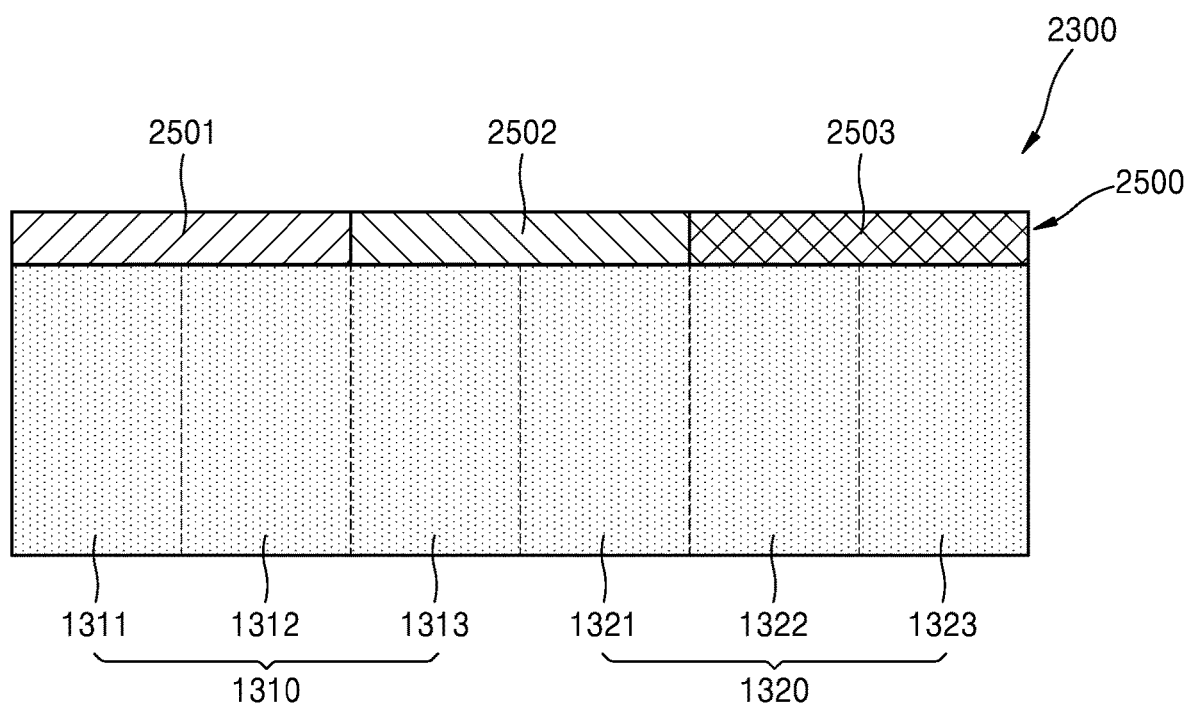
FIG. 16 is a cross-sectional view of a spectral filter according to another example embodiment.

FIG. 16 is a schematic cross-sectional view of a spectral filter 2300 according to another example embodiment.

Referring to FIG. 16, the spectral filter 2300 may include first and second filter array 1310 and 1320 and an additional filter array 2500 provided on the first and second filter array 1310 and 1320.

FIG. 16 illustrates a case in which the first filter array 1310 includes first, second, and third unit filters 1311, 1312, and 1313, and the second filter array 1320 may include fourth, fifth, and sixth unit filters 1321, 1322, and 1323 for convenience sake. The first filter array 1310 may be any one of the first filter arrays 410, 510, 610, 710, 910, and 1010 described above, and the second filter array 1320 may be any one of the second filter arrays 420, 520, 620, 720, 920, and 1020 described above. The descriptions of the first and second filter arrays 1310 and 1320 are omitted.

The additional filter array 2500 may include a plurality of first to third additional filters 2501, 2502, and 2503. FIG. 16 illustrates a case in which the first additional filter 2501 is provided to correspond to the first and second unit filters 1311 and 1312, the second additional filter 2502 is provided to correspond to the third and fourth unit filters 1313 and 1321, and the third additional filter 2503 is provided to correspond to the fifth and sixth unit filters 1322 and 1323. However, this is merely exemplary, and each of the first, second, and third additional filters 2501, 2502, and 2503 may be provided to correspond to one unit filter (1311, 1312, 1313, 1321, 1322, or 1323) or three or more unit filters (1311, 1312, 1313, 1321, 1322, and 1323).

Each of the first, second, and third additional filters 2501, 2502, and 2503 may block light in a wavelength band that the corresponding unit filters (1311, 1312, 1313, 1321, 1322, and 1323) do not desire. For example, when the first and second unit filters 1311 and 1312 have center wavelengths in a wavelength band of about 400 nm to about 500 nm, the first additional filter 2501 may include a blue filter that transmits blue light. Furthermore, when the third and fourth unit filters 1313 and 1321 have center wavelengths in a wavelength band of about 500 nm to about 600 nm, the second additional filter 2502 may include a green filter that transmits green light. When the fifth and sixth unit filters 1322 and 1323 have center wavelengths in a wavelength band of about 600 nm to about 700 nm, the third additional filter 2503 may include a red filter that transmits red light.

The additional filter array 2500 may include a color filter array. In this case, the first, second, and third additional filters 2501, 2502, and 2503 may respectively include blue, green, and red color filters. For example, typical color filters applied to color display apparatuses such as liquid crystal display apparatuses, organic light-emitting display apparatuses, and the like may be used as the blue, green, and red color filters.

The additional filter array 2500 may include a broadband filter array. In this case, the first, second, and third additional filters 2501, 2502, and 2503 may respectively include first, second, and third broadband filters. Each of the first, second, and third broadband filters may have, for example, a multi-cavity structure or a metal mirror structure.

Figure 17:
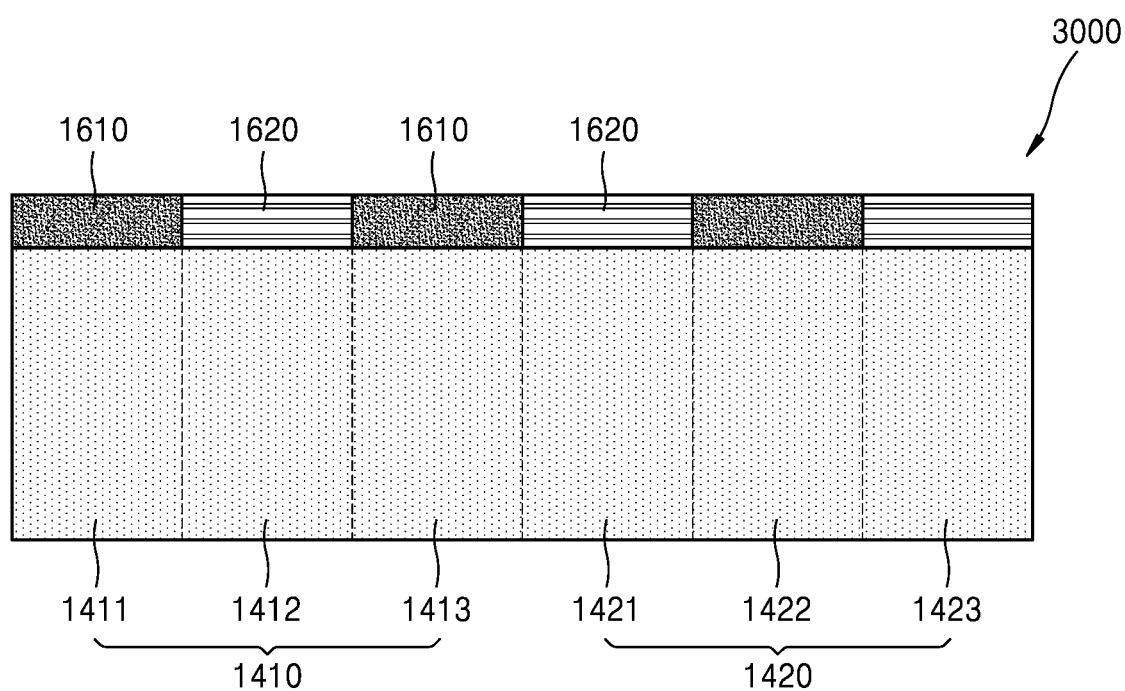
FIG. 17 is a cross-sectional view of a spectral filter according to another example embodiment.

FIG. 17 is a schematic cross-sectional view of a spectral filter 3000 according to another example embodiment.

Referring to FIG. 17, the spectral filter 3000 may include first and second filter arrays 1410 and 1420, and a short wavelength absorption filter 1610 and a long wavelength cut-off filter 1620 provided on the first and second filter arrays 1410 and 1420.

FIG. 17 illustrates a case in which the first filter array 1410 includes first, second, and third unit filters 1411, 1412, and 1413, and the second filter array 1420 includes fourth, fifth, and sixth unit filters 1421, 1422, and 1423 for convenience sake. The first filter array 1410 may be any one of the first filter arrays 410, 510, 610, 710, 910, and 1010 described above, and the second filter array 1420 may be any one of the second filter arrays 420, 520, 620, 720, 920, and 1020 described above. Additional descriptions of the first and second filter arrays 1410 and 1420 are omitted.

The short wavelength absorption filter 1610 may be provided in some unit filters (1411, 1413, and 1422) of the unit filters 1411, 1412, 1413, 1421, 1422, and 1423, and the long wavelength cut-off filter 1620 may be provided in the other unit filters (1412, 1421, and 1423) of the unit filters 1411, 1412, 1413, 1421, 1422, and 1423. Although FIG. 17 illustrates a case in which each of the short wavelength absorption filter 1610 and the long wavelength cut-off filter 1620 is provided to correspond to one unit filter (1411, 1412, 1413, 1421, 1422, or 1423), the disclosure is not limited thereto, and each of the short wavelength absorption filter 1610 and the long wavelength cut-off filter 1620 may be provided to correspond to two or more unit filters (1411, 1412, 1413, 1421, 1422, and 1423).

The short wavelength absorption filter 1610 may cut off, for example, light of a short wavelength such as visible light. The short wavelength absorption filter 1610 may be manufactured by depositing, for example, silicon that is a material for absorbing visible light, on some unit filters (1411, 1413, and 1422) of the first to sixth unit filters 1411, 1412, 1413, 1421, 1422, and 1423. The unit filters (1411, 1413, and 1422) where the short wavelength absorption filter 1610 is provided may transmit near infrared (NIR) light having a wavelength longer than the visible light.

The long wavelength cut-off filter 1620 may cut off, for example, light having a long wavelength such as NIR light. The long wavelength cut-off filter 1620 may include a NIR light cut-off filter. The unit filters (1412, 1421, and 1423) where the long wavelength cut-off filter 1620 is provided may transmit visible light having a wavelength shorter than NIR light.

According to an example embodiment, as the short wavelength absorption filter 1610 and the long wavelength cut-off filter 1620 are provided on the first and second filter arrays 1410 and 1420, the spectral filter 3000 having the broadband characteristics capable of implementing from a visible light band to an NIR band may be manufactured.

Figure 18:
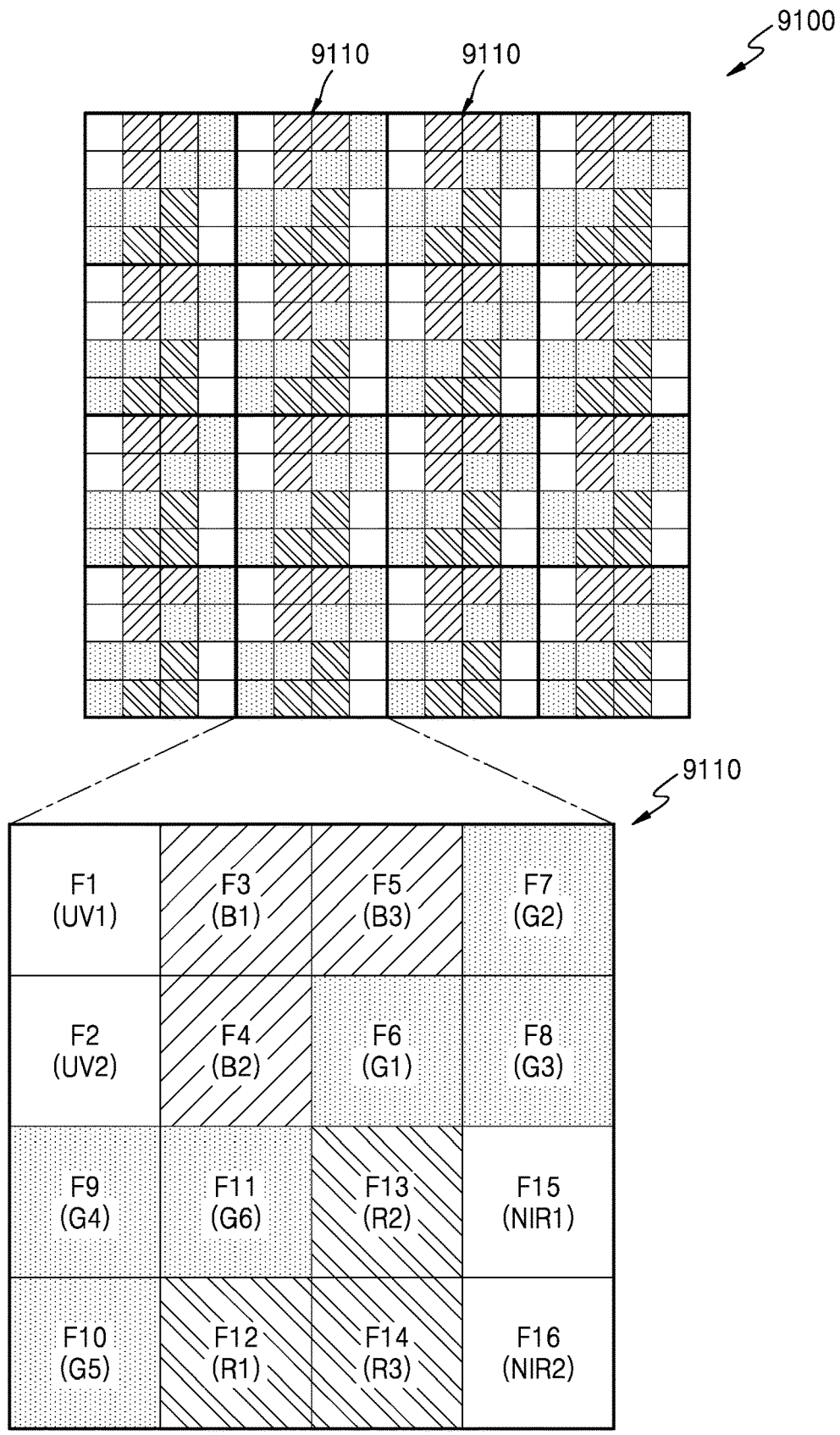
FIG. 18 is a plan view of an example of a spectral filter that is applicable to the image sensor of FIG. 1.

FIG. 18 is a plan view of an example of a spectral filter 9100 that is applicable to the image sensor 1000 of FIG. 1.

Referring to FIG. 18, the spectral filter 9100 may include a plurality of filter groups 9110 arranged in two dimensions. Each of the filter groups 9110 may include sixteen unit filters F1 to F16 arranged in a 4×4 array.

The first and second unit filters F1 and F2 may have center wavelengths UV1 and UV2 in an ultraviolet range, and the third to fifth unit filters F3 to F5 may have center wavelengths B1 to B3 in a blue light range. The sixth to eleventh unit filter F6 to F11 may have center wavelengths G1 to G6 in a green light range, and the twelfth to fourteenth unit filters F12 to F14 may have center wavelengths R1 to R3 in a red light range. The fifteenth and sixteenth unit filters F15 and F16 may have center wavelengths NIR1 and NIR2 in a near infrared range.

Figure 19:
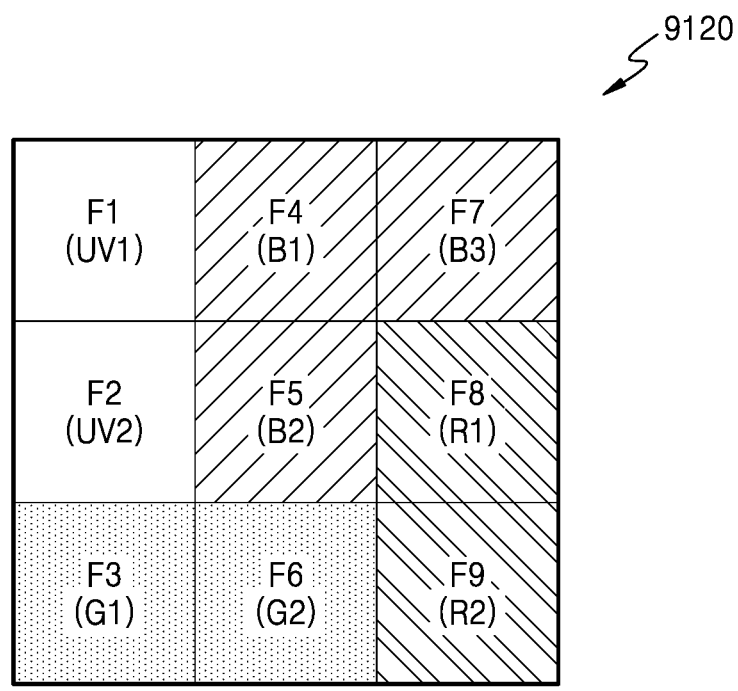
FIG. 19 is a plan view of another example of the spectral filter that is applicable to the image sensor of FIG. 1.

FIG. 19 is a plan view of another example of the spectral filter 9100 that is applicable to the image sensor 1000 of FIG. 1. FIG. 19 is a plan view of one filter group 9120, for convenience of explanation.

Referring to FIG. 19, each filter group 9120 may include nine unit filters F1 to F9 arranged in a 3×3 array. The first and second unit filters F1 and F2 may have center wavelengths UV1 and UV2 in the ultraviolet range, and the fourth, fifth, and seventh unit filter F4, F5, and F7 may have center wavelengths B1 to B3 in the blue light range. The third and sixth unit filters F3 and F6 may have center wavelengths G1 and G2 in the green light range, and the eighth and ninth unit filters F8 and F9 may have center wavelengths R1 and R2 in the red light range.

Figure 20:
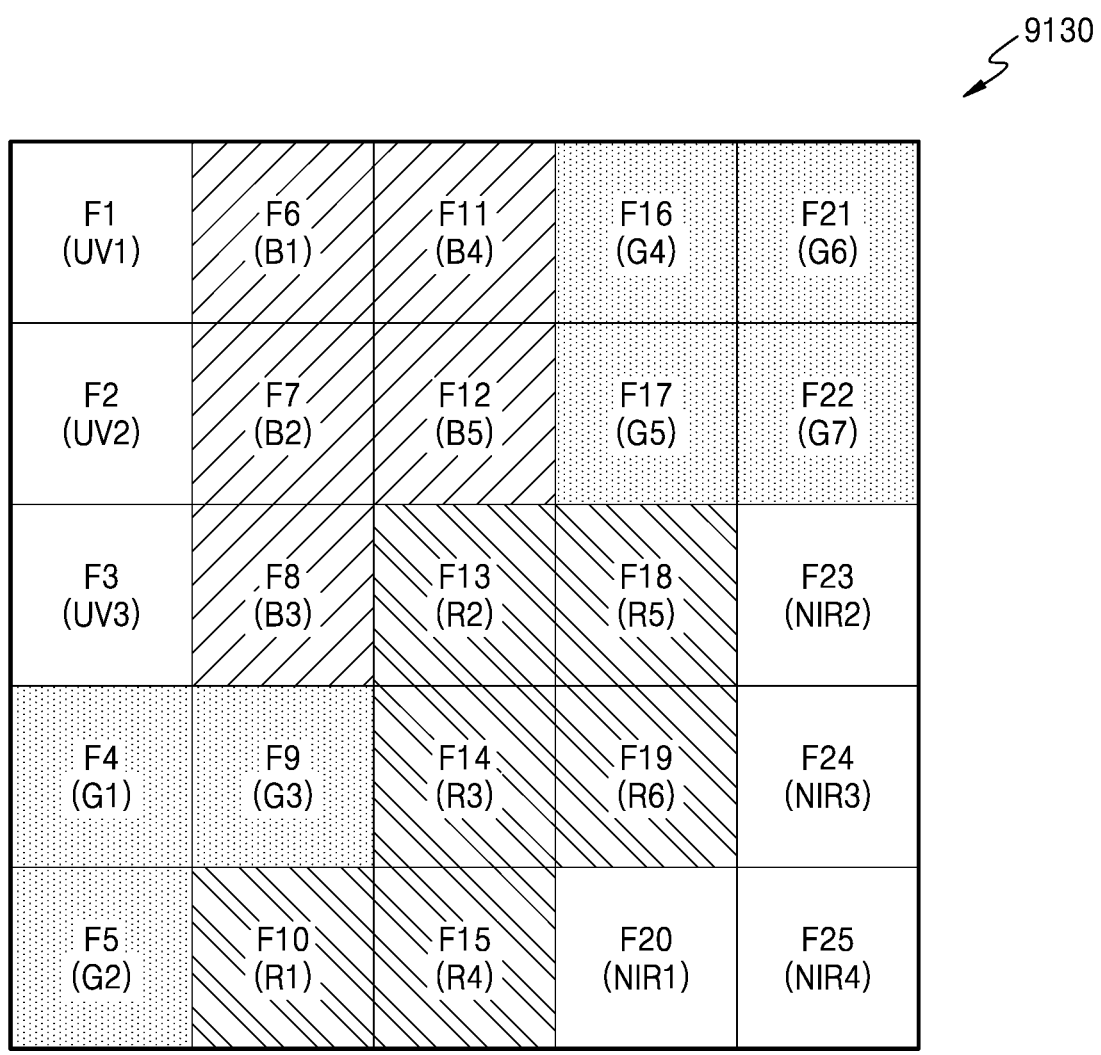
FIG. 20 is a plan view of another example of a spectral filter that is applicable to the image sensor of FIG. 1.

FIG. 20 is a plan view of another example of the spectral filter 9100 that is applicable to the image sensor 1000 of FIG. 1. FIG. 20 is a plan view of one filter group 9130, for convenience of explanation.

Referring to FIG. 20, each filter group 9130 may include twenty-five unit filters F1 to F25 arranged in a 5×5 array. The first to third unit filter F1 to F3 may have center wavelengths UV1 to UV3 in the ultraviolet range, and the sixth, seventh, eighth, eleventh, and twelfth unit filters F6, F7, F8, F11, and F12 may have center wavelengths B1 to B5 in the blue light range. The fourth, fifth, and ninth unit filters F4, F5, and F9 may have center wavelengths G1 to G3 in the green light range, and the tenth, thirteenth, fourteenth, fifteenth, eighteenth, and nineteenth unit filters F10, F13, F14, F15, F18, and F19 may have center wavelengths R1 to R6 in a red light range. The twentieth, twenty-third twenty-fourth, and twenty-fifth unit filters F20, F23, F24, and F25 may have center wavelengths NIR1 to NIR4 in the near infrared range.

The image sensor 1000 having the above-described spectral filter may be employed in various high performance optical devices or high performance electronic devices. The electronic devices may include, for example, smart phones, mobile phones, cellular phones, personal digital assistants (PDAs), laptop computers, personal computers (PCs), various portable devices, home appliances, security cameras, medical cameras, automobiles, Internet of Things (IoT) devices, and other mobile or no-mobile computing devise, but the disclosure is not limited thereto.

The electronic devices may further include, in addition to the image sensor 1000, a processor for controlling an image sensor, for example, a application processor (AP), control a number of hardware or software constituent elements by driving operating systems or application programs through the processor, and perform various data processing and calculations. The processors may further include graphics processing units (GPUs) and/or image signal processors. When the processors include image signal processors, an image (or video) obtained through an image sensor may be stored and/or output using the processor.

Figure 21:
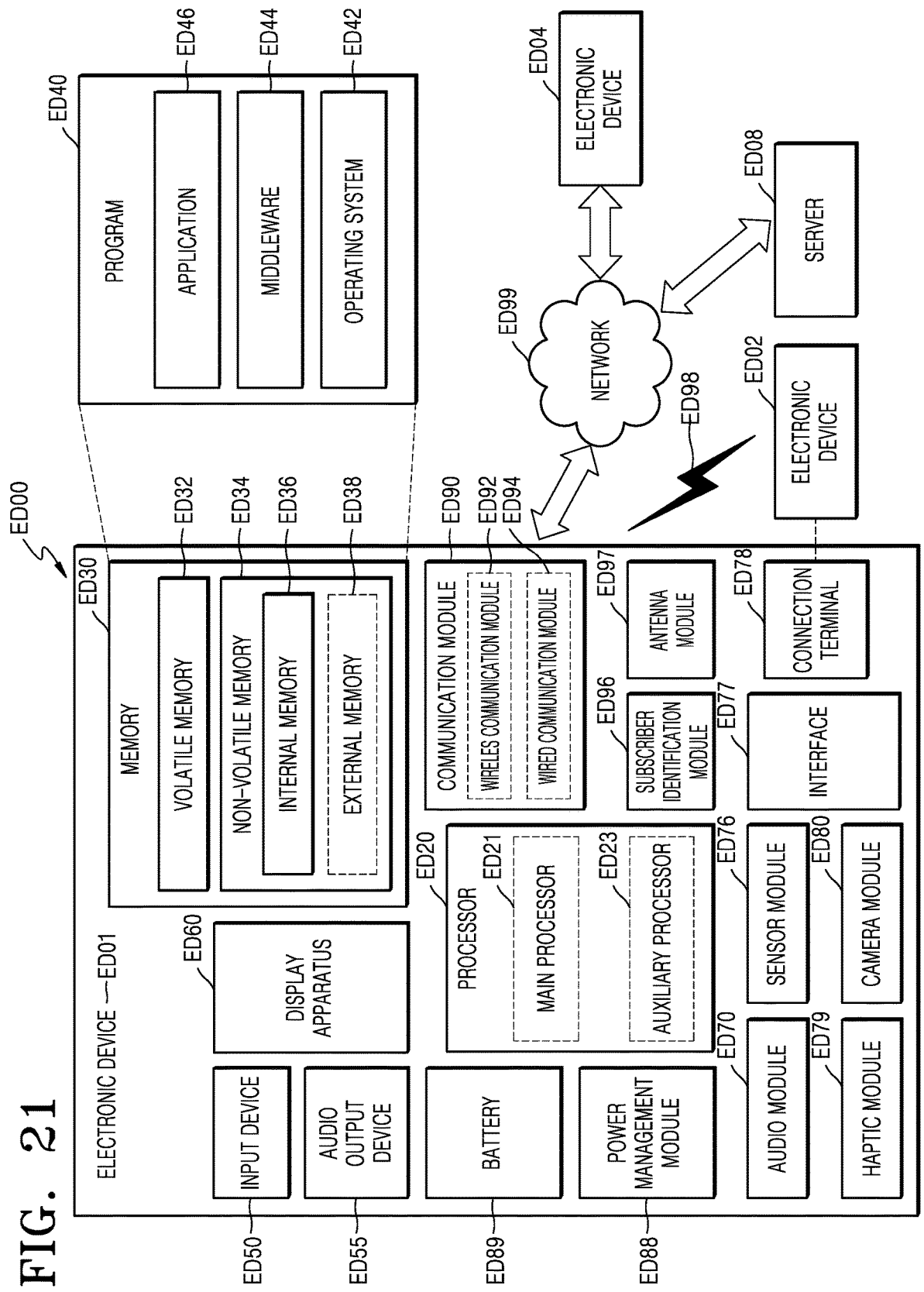
FIG. 21 is a schematic block diagram of an electronic device including an image sensor, according to example embodiments.

FIG. 21 is a schematic block diagram of an electronic device ED01 including the image sensor 1000, according to an example embodiment. Referring to FIG. 21, in a network environment ED00, the electronic device ED01 may communicate with another electronic device ED02 through a first network ED98 (short-range wireless communication network, and the like), or communicate with another electronic device ED04 and/or a server ED08 through a second network ED99 (long-range wireless communication network, and the like). The electronic device ED01 may communicate with the electronic device ED04 through the server ED08. The electronic device ED01 may include a processor ED20, a memory ED30, an input device ED50, an audio output device ED55, a display apparatus ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic device ED01, some (the display apparatus ED60, and the like) of constituent elements may be omitted or other constituent elements may be added. Some of the constituent elements may be implemented by one integrated circuit. For example, the sensor module ED76 (a fingerprint sensor, an iris sensor, an illuminance sensor, and the like) may be implemented by being embedded in the display apparatus ED60 (a display, and the like). Furthermore, when the image sensor 1000 includes a spectral function, some functions (a color sensor and an illuminance sensor) of the sensor module ED76 may be implemented by the image sensor 1000, not by a separate sensor module.

The processor ED20 may control one or a plurality of other constituent elements (hardware and software constituent elements, and the like) of the electronic device ED01 connected to the processor ED20 by executing software (a program ED40, and the like), and perform various data processing or calculations. As part of the data processing or calculations, the processor ED20 may load, in a volatile memory ED32, commands and/or data received from other constituent elements (the sensor module ED76, the communication module ED90, and the like), process the command and/or data stored in the volatile memory ED32, and store result data in a non-volatile memory ED34. The processor ED20 may include a main processor ED21 (a central processing unit, an application processor, and the like) and an auxiliary processor ED23 (a graphics processing unit, an image signal processor, a sensor hub processor, a communication processor, and the like) that is operable independently of or together with the main processor ED21. The auxiliary processor ED23 may use less power than the main processor ED21 and may perform a specialized function.

Instead of the main processor ED21 when the main processor ED21 is in an inactive state (sleep state), or with the main processor ED21 when the main processor ED21 is in an active state (application execution state), the auxiliary processor ED23 may control functions and/or states related to some constituent elements (the display apparatus ED60, the sensor module ED76, the communication module ED90, and the like) of the constituent elements of the electronic device ED01. The auxiliary processor ED23 (an image signal processor, a communication processor, and the like) may be implemented as a part of functionally related other constituent elements (the camera module ED80, the communication module ED90, and the like).

The memory ED30 may store various data needed by the constituent elements (the processor ED20, the sensor module ED76, and the like) of the electronic device ED01. The data may include, for example, software (the program ED40, and the like) and input data and/or output data about commands related thereto. The memory ED30 may include the volatile memory ED32 and/or the non-volatile memory ED34. The non-volatile memory ED34 may include an internal memory ED36 fixedly installed in the electronic device ED01 and an external memory ED38 that is removable.

The program ED40 may be stored in the memory ED30 as software, and may include an operating system ED42, middleware ED44, and/or an application ED46.

The input device ED50 may receive commands and/or data to be used for constituent elements (the processor ED20, and the like) of the electronic device ED01, from the outside (a user, and the like) of the electronic device ED01. The input device ED50 may include a microphone, a mouse, a keyboard, and/or a digital pen (a stylus pen, and the like).

The audio output device ED55 may output an audio signal to the outside of the electronic device ED01. The audio output device ED55 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display apparatus ED60 may visually provide information to the outside of the electronic device ED01. The display apparatus ED60 may include a display, a hologram device, or a projector, and a control circuit to control a corresponding device. The display apparatus ED60 may include a touch circuitry set to detect a touch and/or a sensor circuit (a pressure sensor, and the like) set to measure the strength of a force generated by the touch.

The audio module ED70 may convert sound into electrical signals or reversely electrical signals into sound. The audio module ED70 may obtain sound through the input device ED50, or output sound through a speaker and/or a headphone of another electronic device (the electronic device ED02, and the like) connected to the audio output device ED55 and/or the electronic device ED01 in a wired or wireless manner.

The sensor module ED76 may detect an operation state (power, temperature, and the like) of the electronic device ED01, or an external environment state (a user state, and the like), and generate an electrical signal and/or a data value corresponding to a detected state. The sensor module ED76 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface ED77 may support one or a plurality of specified protocols used for the electronic device ED01 to be connected to another electronic device (the electronic device ED02, and the like) in a wired or wireless manner. The interface ED77 may include a high definition multimedia interface (HDMI), a universal serial bus (USB) interface, an SD card interface, and/or an audio interface.

A connection terminal ED78 may include a connector for the electronic device ED01 to be physically connected to another electronic device (the electronic device ED02, and the like). The connection terminal ED78 may include an HDMI connector, a USB connector, an SD card connector, and/or an audio connector (a headphone connector, and the like).

The haptic module ED79 may convert electrical signals into mechanical stimuli (vibrations, movements, and the like) or electrical stimuli that are perceivable by a user through tactile or motor sensations. The haptic module ED79 may include a motor, a piezoelectric device, and/or an electrical stimulation device.

The camera module ED80 may capture a still image and a video. The camera module ED80 may include a lens assembly including one or a plurality of lenses, the image sensor 1000 of FIG. 1, image signal processors, and/or flashes. The lens assembly included in the camera module ED80 may collect light emitted from a subject for image capturing.

The power management module ED88 may manage power supplied to the electronic device ED01. The power management module ED88 may be implemented as a part of a power management integrated circuit (PMIC).

The battery ED89 may supply power to the constituent elements of the electronic device ED01. The battery ED89 may include non-rechargeable primary cells, rechargeable secondary cells, and/or fuel cells.

The communication module ED90 may establish a wired communication channel and/or a wireless communication channel between the electronic device ED01 and another electronic device (the electronic device ED02, the electronic device ED04, the server ED08, and the like), and support a communication through an established communication channel. The communication module ED90 may be operated independent of the processor ED20 (the application processor, and the like), and may include one or a plurality of communication processors supporting a wired communication and/or a wireless communication. The communication module ED90 may include a wireless communication module ED92 (a cellular communication module, a short-range wireless communication module, a global navigation satellite system (GNSS) communication module, and the like), and/or a wired communication module ED94 (a local area network (LAN) communication module, a power line communication module, and the like). Among the above communication modules, a corresponding communication module may communicate with another electronic device through the first network ED98 (a short-range communication network such as Bluetooth, WiFi Direct, or infrared data association (IrDA)) or the second network ED99 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module ED92 may verify and authenticate the electronic device ED01 in a communication network such as the first network ED98 and/or the second network ED99 by using subscriber information (an international mobile subscriber identifier (IMSI), and the like) stored in the subscriber identification module ED96.

The antenna module ED97 may transmit signals and/or power to the outside (another electronic device, and the like) or receive signals and/or power from the outside. An antenna may include an emitter formed in a conductive pattern on a substrate (a printed circuit board (PCB), and the like). The antenna module ED97 may include one or a plurality of antennas. When the antenna module ED97 includes a plurality of antennas, the communication module ED90 may select, from among the antennas, an appropriate antenna for a communication method used in a communication network such as the first network ED98 and/or the second network ED99. Signals and/or power may be transmitted or received between the communication module ED90 and another electronic device through the selected antenna. Other parts (an RFIC, and the like) than the antenna may be included as a part of the antenna module ED97.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device ED01 and the external electronic device ED04 through the server ED08 connected to the second network ED99. The electronic devices ED02 and ED04 may be of a type that is the same as or different from the electronic device ED01. All or a part of operations executed in the electronic device ED01 may be executed in one or a plurality of the electronic devices (ED02, ED04, and ED08). For example, when the electronic device ED01 needs to perform a function or service, the electronic device ED01 may request one or a plurality of electronic devices to perform part of the whole of the function or service, instead of performing the function or service. The one or a plurality of the electronic devices receiving the request may perform additional function or service related to the request, and transmit a result of the performance to the electronic device ED01. To this end, cloud computing, distributed computing, and/or client-server computing technology may be used.

Figure 22:
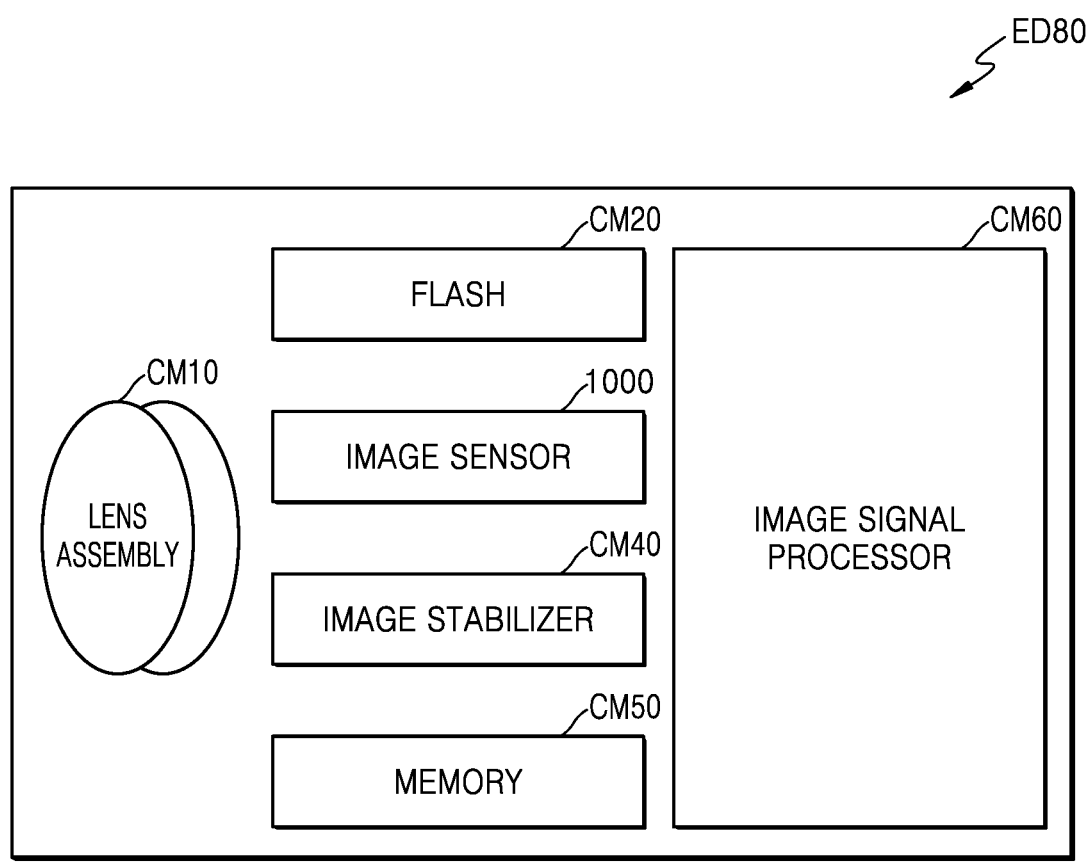
FIG. 22 is a schematic block diagram of a camera module of FIG. 21.

FIG. 22 is a schematic block diagram of the camera module ED80 of FIG. 21. Referring to FIG. 22, the camera module ED80 may include a lens assembly CM10, a flash CM20, the image sensor 1000 (the image sensor 1000 of FIG. 1, and the like), an image stabilizer CM40, a memory CM50 (a buffer memory, and the like), and/or an image signal processor CM60. The lens assembly CM10 may collect light emitted from a subject for image capturing. The camera module ED80 may include a plurality of lens assemblies CM10, and in this case, the camera module ED80 may include a dual camera, a 360 degrees camera, or a spherical camera. Some of the lens assemblies CM10 may have the same lens attributes (a viewing angle, a focal length, auto focus, F Number, optical zoom, and the like), or different lens attributes. The lens assembly CM10 may include a wide angle lens or a telescopic lens.

The flash CM20 may emit light used to reinforce light emitted or reflected from a subject. The flash CM20 may include one or a plurality of light-emitting diodes (a red-green-blue (RGB) LED, a white LED, an infrared LED, an ultraviolet LED, and the like), and/or a xenon lamp. The image sensor 1000 may include the image sensor of FIG. 1, and convert light emitted or reflected from the subject and transmitted through the lens assembly CM10 into electrical signals, thereby obtaining an image corresponding to the subject. The image sensor 1000 may include one or a plurality of sensors selected from image sensors having different attributes such as an RGB sensor, a black and white (BW) sensor, an IR sensor, or UV sensor. Each sensor included in the image sensor 1000 may be implemented by a charged coupled device (CCD) sensor and/or a complementary metal oxide semiconductor (CMOS) sensor.

The image stabilizer CM40 may move, in response to a movement of the camera module ED80 or an electronic device ED01 including the same, one or a plurality of lenses included in the lens assembly CM10 or the image sensor 1000 in a particular direction or may compensate a negative effect due to the movement by controlling (adjusting a read-out timing, and the like) the movement characteristics of the image sensor 1000. The image stabilizer CM40 may detect a movement of the camera module ED80 or the electronic device ED01 by using a gyro sensor (not shown) or an acceleration sensor (not shown) arranged inside or outside the camera module ED80. The image stabilizer CM40 may be implemented in an optical form.

The memory CM50 may store a part or entire data of an image obtained through the image sensor 1000 for a subsequent image processing operation. For example, when a plurality of images are obtained at high speed, only low resolution images are displayed while the obtained original data (Bayer-Patterned data, high resolution data, and the like) is stored in the memory CM50. Then, the memory CM50 may be used to transmit the original data of a selected (user selection, and the like) image to the image signal processor CM60. The memory CM50 may be incorporated into the memory ED30 of the electronic device ED01, or configured to be an independently operated separate memory.

The image signal processor CM60 may perform image processing on the image obtained through the image sensor 1000 or the image data stored in the memory CM50. The image processing may include depth map generation, three-dimensional modeling, panorama generation, feature point extraction, image synthesis, and/or image compensation (noise reduction, resolution adjustment, brightness adjustment, blurring, sharpening, softening, and the like). The image signal processor CM60 may perform control (exposure time control, or read-out timing control, and the like) on constituent elements (the image sensor 1000, and the like) included in the camera module ED80. The image processed by the image signal processor CM60 may be stored again in the memory CM50 for additional processing or provided to external constituent elements (the memory ED30, the display apparatus ED60, the electronic device ED02, the electronic device ED04, the server ED08, and the like) of the camera module ED80. The image signal processor CM60 may be incorporated into the processor ED20, or configured to be a separate processor operated independently of the processor ED20. When the image signal processor CM60 is configured by a separate processor from the processor ED20, the image processed by the image signal processor CM60 may undergo additional image processing by the processor ED20 and then displayed through the display apparatus ED60.

The electronic device ED01 may include a plurality of camera modules ED80 having different attributes or functions. In this case, one of the camera modules ED80 may be a wide angle camera, and another may be a telescopic camera. Similarly, one of the camera modules ED80 may be a front side camera, and another may be a read side camera.

Figure 23:
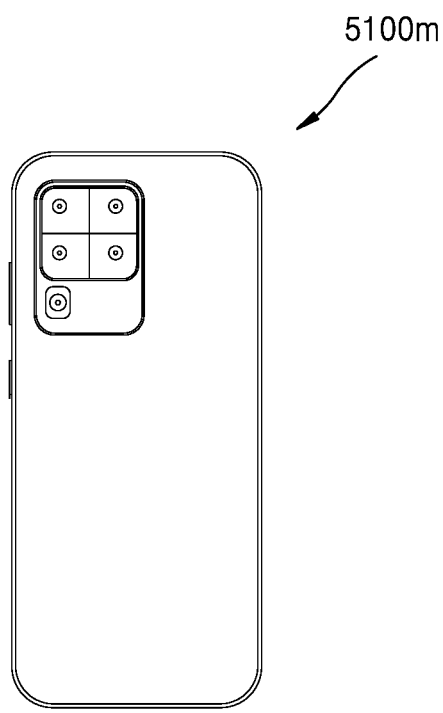
FIGS. 23 to 32 are views of various examples of electronic devices to which an image sensor is applied, according to example embodiments.
Figure 24:
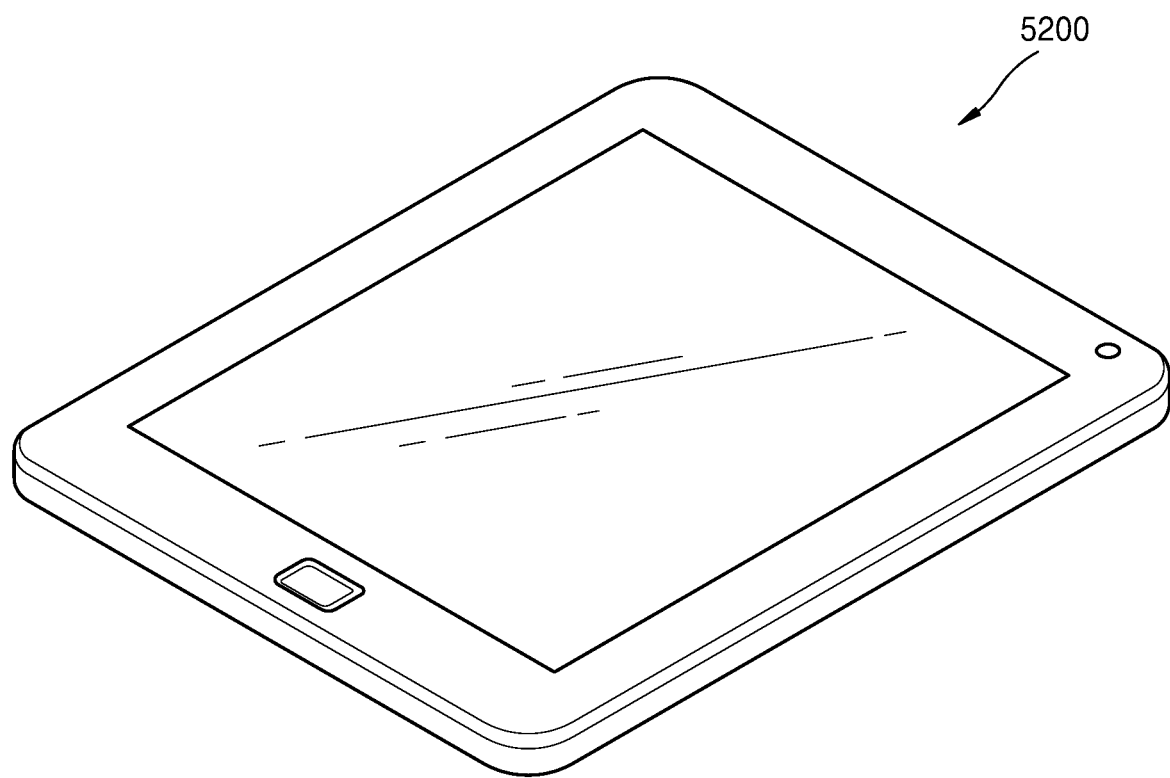
Figure 25:
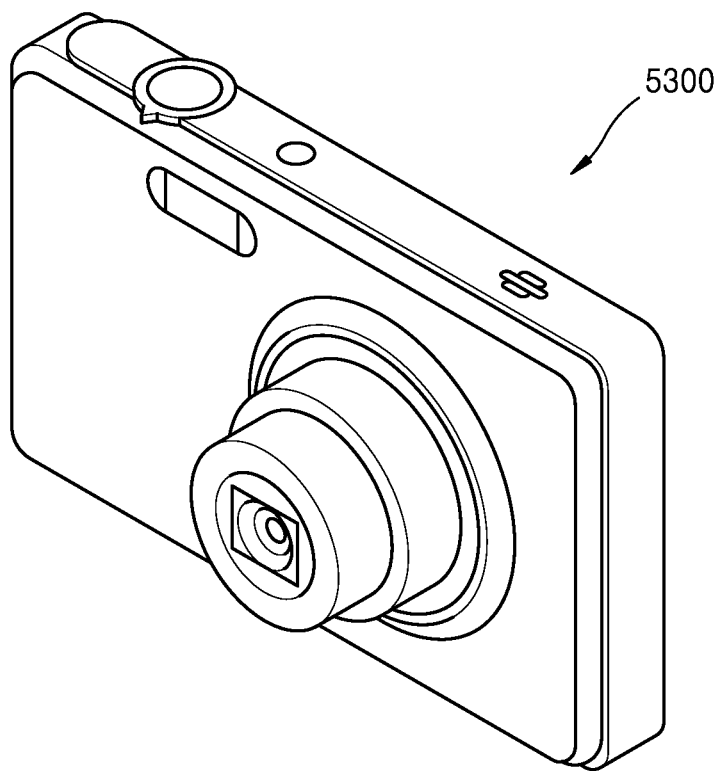
Figure 26:
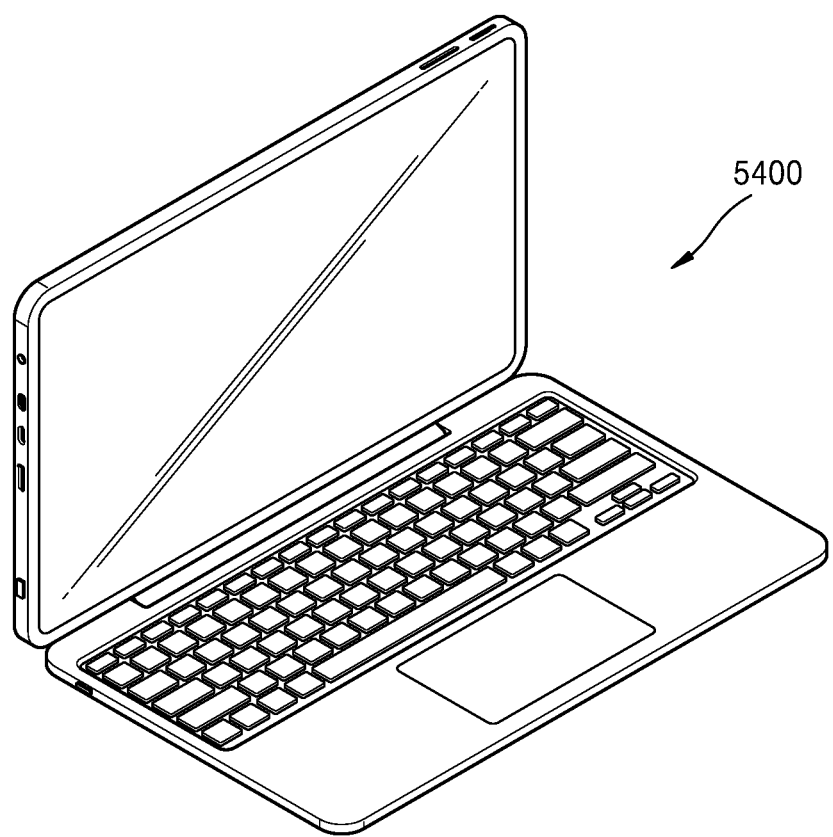
Figure 27:
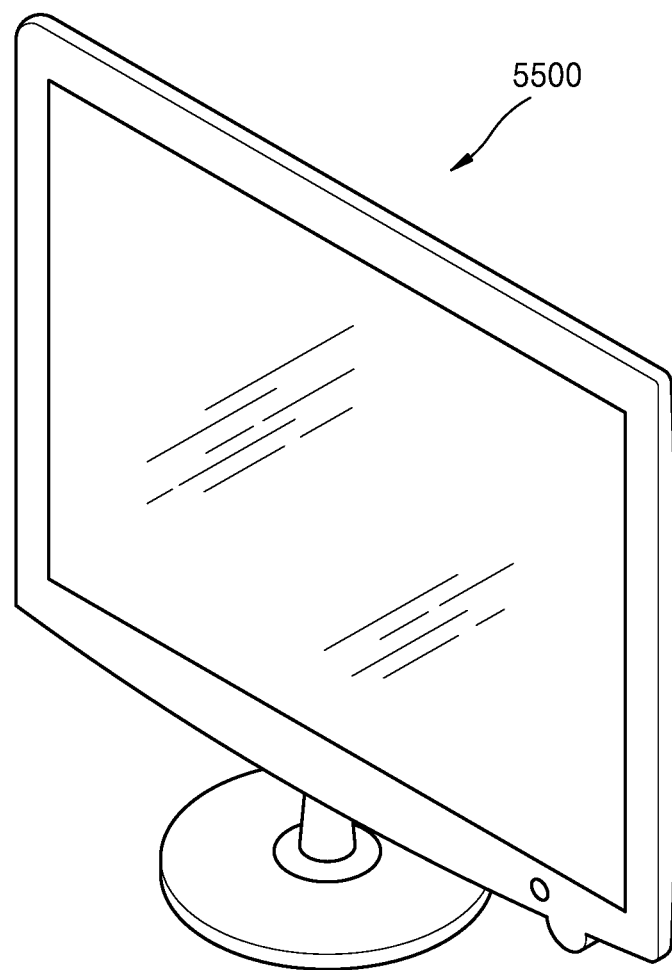

The image sensor 1000 according to example embodiments may be applied to a mobile phone or smartphone 5100$m$ illustrated in FIG. 23, a tablet or smart tablet 5200 illustrated in FIG. 24, a digital camera or camcorder 5300 illustrated in FIG. 25, a notebook computer 5400 illustrated in FIG. 26, a television or smart television 5500 illustrated in FIG. 27, and the like. For example, the smartphone 5100m or the smart tablet 5200 may include a plurality of high resolution cameras, each having a high resolution image sensor mounted thereon. Depth information of subjects in an image may be extracted by using a high resolution cameras, out focusing of the image may be adjusted, or subjects in the image may be automatically identified.

Figure 28:
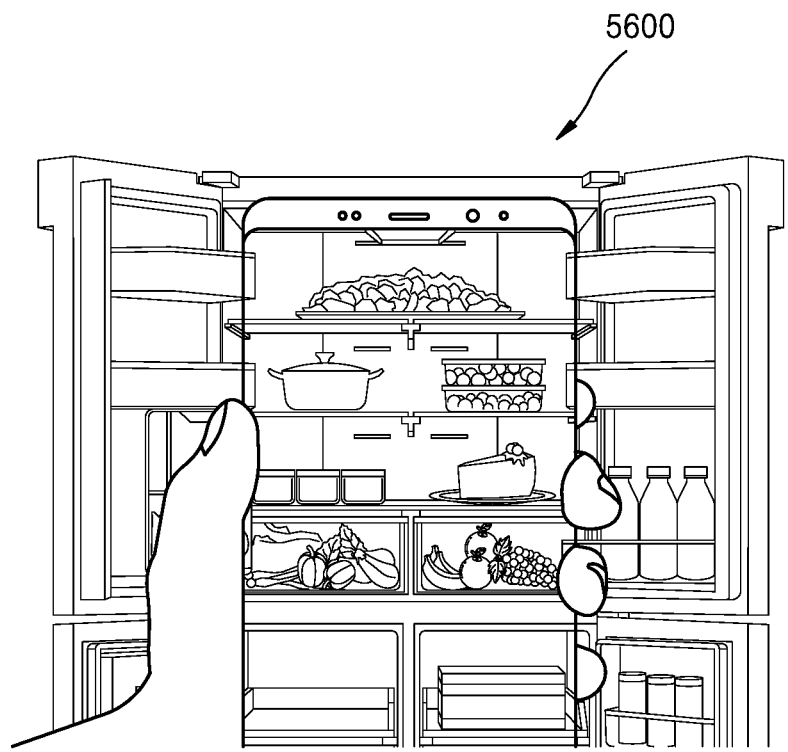
Figure 29:
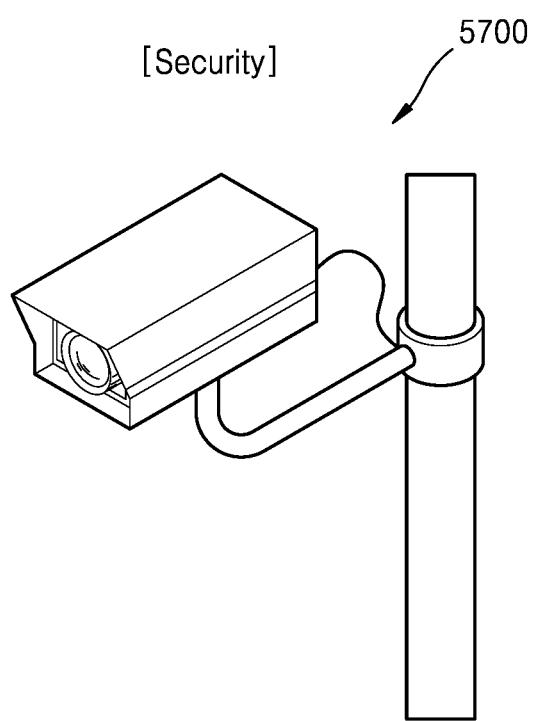
Figure 30:
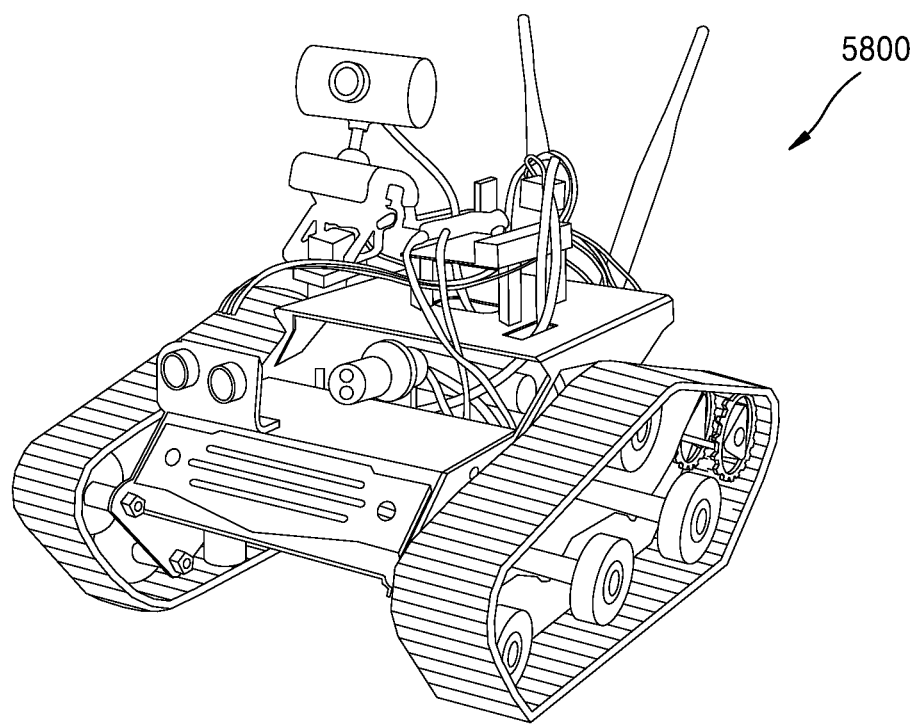
Figure 31:
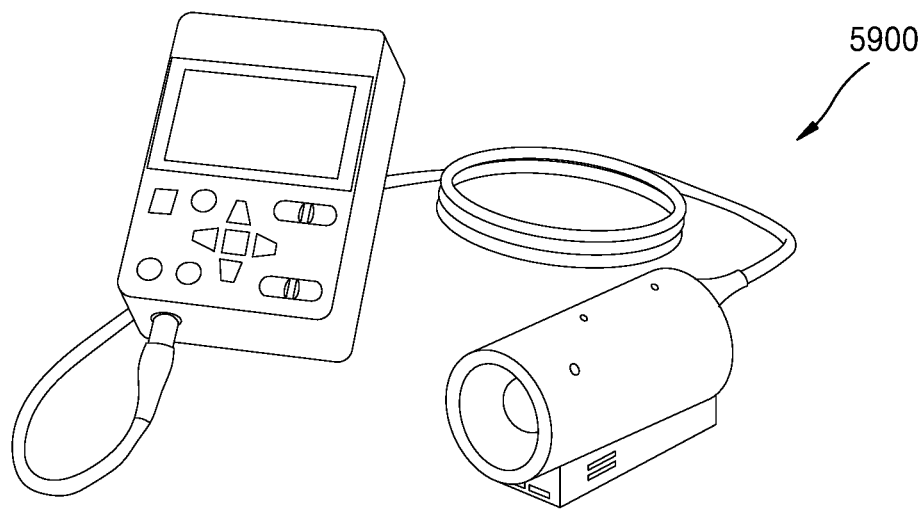

Furthermore, the image sensor 1000 may be applied to a smart refrigerator 5600 illustrated in FIG. 28, a security camera 5700 illustrated in FIG. 29, a robot 5800 illustrated in FIG. 30, a medical camera 5900 illustrated in FIG. 31, and the like. For example, the smart refrigerator 5600 may automatically recognize food in a refrigerator, by using an image sensor, and notify a user of the presence of a particular food, the type of food that is input or output, and the like, through a smartphone. The security camera 5700 may provide an ultrahigh resolution image and may recognize an object or a person in an image in a dark environment by using high sensitivity. The robot 5800 may be provided in a disaster or industrial site that is not directly accessible by people, and may provide a high resolution image. The medical camera 5900 may provide a high resolution image for diagnosis or surgery, and thus a field of vision may be dynamically adjusted.

Figure 32:
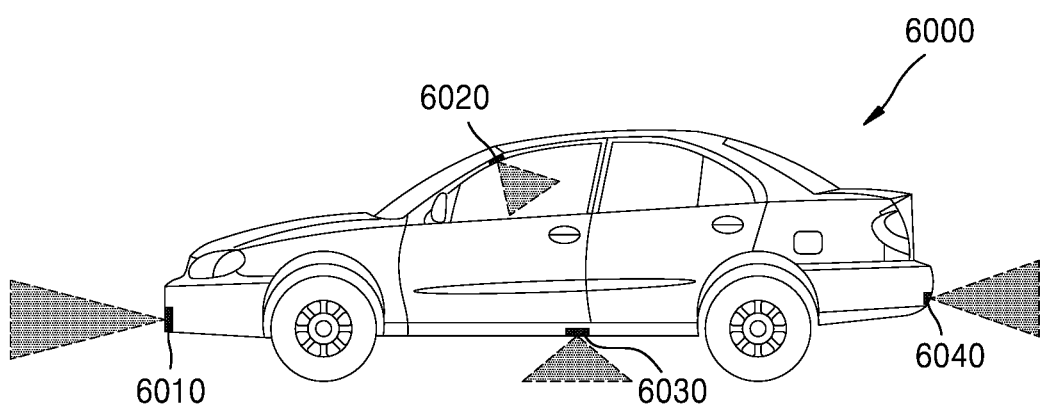

Furthermore, the image sensor 1000 may be applied to a vehicle 6000 as illustrated in FIG. 32. The vehicle 6000 may include a plurality of vehicle cameras 6010, 6020, 6030, and 6040 arranged at various positions. Each of the vehicle cameras 6010, 6020, 6030, and 6040 may include an image sensor according to an example embodiment. The vehicle 6000 may provide a driver with various pieces of information about the inside or periphery of the vehicle 6000, by using the vehicle cameras 6010, 6020, 6030, and 6040, and thus an object or a person in an image may be automatically recognized and information needed for autonomous driving is provided.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims and their equivalents.

What is claimed is:

1. A spectral filter comprising:
   two first reflective layers spaced apart from each other and facing each other; and
   at least a first cavity and a second cavity provided between the two first reflective layers, wherein the first cavity has a thicknesses different from a thickness of the second cavity, the thickness of the first cavity determined according to a first center wavelength, and the thickness of the second cavity determined according to a second center wavelength,
   wherein each of the first cavity and the second cavity includes a plurality of etch stop layers having a constant total thickness,
   wherein the first cavity has a second dielectric layer of one or more dielectric layers, and the second cavity has a first dielectric layer of the one or more dielectric layers,
   wherein a thickness of the second dielectric layer and a thickness of the first dielectric layer differ from each other according to the first center wavelength of the first cavity and the second center wavelength of the second cavity,
   wherein the plurality of etch stop layers include a first etch stop layer and a second etch stop layer,
   wherein the first cavity includes:
      the first etch stop layer disposed on a lower layer of the two first reflective layers,
      the second etch stop layer directly contacting and disposed on the first etch stop layer, and
      the second dielectric layer disposed on the second etch stop layer, and
   wherein the second cavity includes:
      the first etch stop layer disposed on the lower layer of the two first reflective layers, and
      the first dielectric layer disposed on the first etch stop layer, and
      the second etch stop layer disposed on the first dielectric layer,
   wherein the second etch stop layer is disposed between an upper layer of the two first reflective layers and the first dielectric layer in the second cavity, and
   wherein any of the first dielectric layer and the second dielectric layer is not disposed between the first etch stop layer and the second etch stop layer in the first cavity.

2. The spectral filter of claim 1, further comprising a third cavity, and wherein the first cavity, the second cavity, and the third cavity are arranged in a two dimensional manner between the two first reflective layers,
   wherein the third cavity includes:
      the first etch stop layer disposed on the lower layer of the two first reflective layers,
      the first dielectric layer disposed on the first etch stop,
      the second etch stop layer disposed on the first dielectric layer, and
      the second dielectric layer disposed on the second etch stop layer, and
   wherein the second dielectric layer is disposed between the upper layer of the two first reflective layers and the second etch stop layer.

3. The spectral filter of claim 1,
   wherein a difference between a refractive index of a material included in the one or more dielectric layers and a refractive index of a material included in the etch stop layers is less than or equal to 2.5.

4. The spectral filter of claim 3,
   wherein the difference between the refractive index of the material included in the one or more dielectric layers and the refractive index of the material included in the etch stop layers is less than or equal to 1.

5. The spectral filter of claim 3,
   wherein the plurality of etch stop layers include a silicon oxide, a titanium oxide, or a hafnium oxide, and wherein the plurality of etch stop layers include materials having etch selectivity different from etch selectivity of the one or more dielectric layers by a factor of 5 or more.

6. The spectral filter of claim 5,
   wherein the one or more dielectric layers and the plurality of etch stop layers respectively include a silicon nitride and a hafnium oxide, a silicon nitride and a titanium oxide, a silicon oxide and a hafnium oxide, a silicon oxide and a titanium oxide, or silicon and a silicon oxide.

7. The spectral filter of claim 1,
wherein the one or more dielectric layers include silicon, a silicon oxide or a silicon nitride.

8. The spectral filter of claim 1,
wherein the two first reflective layers include a metal reflective layer.

9. The spectral filter of claim 8,
wherein the metal reflective layer includes Al, Cu, Ag, Au, or TiN.

10. The spectral filter of claim 1,
wherein the first reflective layers include a Bragg reflective layer.

11. The spectral filter of claim 1,
wherein a first transmittance dielectric layer for improving transmittance is provided below the lower layer of the two first reflective layers and a second transmittance dielectric layer is provided above the upper layer of the two first reflective layers.

12. The spectral filter of claim 11,
wherein the first transmittance dielectric layer and the second transmittance dielectric layer have thicknesses which change, respectively, according to center wavelengths of the first cavity and the second cavity.

13. The spectral filter of claim 1, further comprising:
two second reflective layers provided laterally to one side of the two first reflective layers; and
at least a third cavity and a fourth cavity provided between the two second reflective layers, wherein the third cavity has a different thickness than a thickness of the fourth cavity,
wherein each of the third cavity and fourth cavity includes the plurality of etch stop layers, and the third cavity and the fourth cavity include the one more dielectric layers.

14. The spectral filter of claim 13,
wherein at least one of the third cavity and the fourth cavity further includes at least one spacer for adjusting thickness.

15. The spectral filter of claim 13,
wherein the second reflective layers include a metal reflective layer or a Bragg reflective layer.

16. The spectral filter of claim 13,
wherein a first transmittance dielectric layer for improving transmittance is provided below a lower one of the two second reflective layers and a second transmittance dielectric layer is provided above an upper one of the two second reflective layers.

17. A method of manufacturing a spectral filter, the method comprising:
forming a first etch stop layer on a lower reflective layer and forming a first dielectric layer on the first etch stop layer;
etching a part of the first dielectric layer to expose a part of the first etch stop layer;
forming a second etch stop layer on the exposed part of the first etch stop layer and on the first dielectric layer and forming a second dielectric layer on the second etch stop layer;
etching a part of the second dielectric layer to expose a part of the second etch stop layer; wherein at least a top of the second dielectric layer and a top of the exposed part of the second etch stop layer form respective boundaries of a first cavity and a second cavity having different thicknesses from each other; and
forming an upper reflective layer on the first cavity and the second cavity,
wherein the first cavity includes:
the first etch stop layer disposed on the lower reflective layer,
the second etch stop layer directly contacting and disposed on the first etch stop layer, and
the second dielectric layer disposed on the second etch stop layer,
wherein the second cavity includes:
the first etch stop layer disposed on the lower reflective layer,
the first dielectric layer disposed on the first etch stop layer, and
the second etch stop layer disposed on the first dielectric layer,
wherein the second etch stop layer is disposed between the upper reflective layer and the first dielectric layer in the second cavity, and
wherein any of the first dielectric layer and the second dielectric layer is not disposed between the first etch stop layer and the second etch stop layer in the first cavity.

18. The method of claim 17, further comprising:
after etching the part of the second dielectric layer to expose the part of the second etch stop layer, forming a third etch stop layer on the exposed part of the second etch stop layer and on the second dielectric layer and forming a third dielectric layer on the third etch stop layer; and
etching a part of the third dielectric layer to expose a part of the third etch stop layer.

19. The method of claim 17,
wherein a difference between a refractive index of a materials included in the first dielectric layer and the second dielectric layer and a refractive index of a materials included in the first etch stop layer and the second etch stop layer is less than or equal to 2.5.

20. The method of claim 19,
wherein the difference between the refractive index of the materials included in the first dielectric layer and the second dielectric layer and the refractive index of the materials included in the first etch stop layer and the second etch stop layer is less than or equal to 1.

21. The method of claim 20,
wherein the first etch stop layer and the second etch stop layer include a silicon oxide, a titanium oxide, or a hafnium oxide.

22. The method of claim 19,
wherein the first dielectric layer and the second dielectric layer include silicon, a silicon oxide or a silicon nitride, and wherein the first etch stop layer and the second etch stop layer include materials having etch selectivity different from etch selectivity of the first dielectric layer and the second dielectric layer by a factor of 5 or more.

23. The method of claim 17, further comprising forming at least one spacer for adjusting thickness in at least one of the first cavity and the second cavity.

24. The method of claim 17,
wherein each of the lower reflective layer and the upper reflective layer includes a metal reflective layer or a Bragg reflective layer.

25. The method of claim 17,
wherein each of the lower reflective layer and the upper reflective layer includes a first metal reflective layer and a second metal reflective layer arranged on a plane.

26. The method of claim 17,
wherein each of the lower reflective layer and the upper reflective layer includes a metal reflective layer and a Bragg reflective layer arranged on a plane.

27. The method of claim 17, further comprising forming a first transmittance dielectric layer for improving transmittance below the lower reflective layer and forming a second transmittance dielectric layer above the upper reflective layer.

28. The method of claim 27,
wherein the first transmittance dielectric layer for improving transmittance is formed to have different thicknesses according to a center wavelength.

29. The method of claim 17, the spectral filter further comprises a third cavity, and the first cavity, the second cavity, and the third cavity are arranged in a two dimensional manner between the lower reflective layer and the upper reflective layer,
wherein the third cavity includes:
the first etch stop layer disposed on the lower reflective layer,
the first dielectric layer disposed on the first etch stop layer,
the second etch stop layer disposed on the first dielectric layer, and
the second dielectric layer disposed on the second etch stop layer, and
wherein the second dielectric layer is disposed between the upper reflective layer and the second etch stop layer.

30. An image sensor comprising:
a spectral filter; and
a pixel array receiving light transmitted through the spectral filter,
wherein the spectral filter comprises:
two first reflective layers spaced apart from each other and facing each other; and
at least a first cavity and a second cavity provided between the two first reflective layers, wherein the first cavity has a thicknesses from a thickness of the second cavity, the thickness of the first cavity determined according to a first center wavelength, and the thickness of the second cavity determined according to a second center wavelength,
wherein each of the first cavity and the second cavity includes a plurality of etch stop layers having a constant total thickness,
wherein the first cavity has a second dielectric layer of one or more dielectric layers and the second cavity has a first dielectric layer of the one or more dielectric layers, wherein a thickness of the second dielectric layer and a thickness of the first dielectric layer differ from each other according to the first center wavelength of the first cavity and the second center wavelength of the second cavity,
wherein the plurality of etch stop layers include a first etch stop layer and a second etch stop layer,
wherein the first cavity includes:
the first etch stop layer disposed on a lower layer of the two first reflective layers,
the second etch stop layer directly contacting and disposed on the first etch stop layer, and
the second dielectric layer disposed on the second etch stop layer,
wherein the second cavity includes:
the first etch stop layer disposed on the lower layer of the two first reflective layers,
the first dielectric layer disposed on the first etch stop layer, and
the second etch stop layer disposed on the first dielectric layer,
wherein the second etch stop layer is disposed between an upper layer of the two first reflective layers and the first dielectric layer in the second cavity, and
wherein any of the first dielectric layer and the second dielectric layer is not disposed between the first etch stop layer and the second etch stop layer in the first cavity.

31. The image sensor of claim 30,
wherein a difference between a refractive index of a material included in the one or more dielectric layers and a refractive index of a materials included in the etch stop layers is less than or equal to 2.5.

32. The image sensor of claim 31,
wherein the difference between the refractive index of the material included in the one or more dielectric layers and the refractive index of the materials included in the etch stop layers is less than or equal to 1.

33. The image sensor of claim 31,
wherein the plurality of etch stop layers include a silicon oxide, a titanium oxide, or a hafnium oxide, and wherein the plurality of etch stop layers include materials having etch selectivity different from etch selectivity of the one or more dielectric layers by a factor of 5 or more.

34. The image sensor of claim 30,
wherein the one or more dielectric layers include silicon, a silicon oxide, or a silicon nitride.

35. The image sensor of claim 30,
wherein the first reflective layers include a metal reflective layer or a Bragg reflective layer.

36. The image sensor of claim 30,
wherein the spectral filter further comprises:
two second reflective layers provided laterally to one side of the two first reflective layers; and
at least a third cavity and a fourth cavity provided between the two second reflective layers, wherein the third cavity has a different thickness than the fourth cavity, and
wherein each of the third cavity and the fourth cavity includes the plurality of etch stop layers, and the third cavity and the fourth cavity include one or more dielectric layers.

37. The image sensor of claim 36,
wherein at least one of the third cavity and the fourth cavity further includes at least one spacer for adjusting thickness.

38. The image sensor of claim 36,
wherein the two second reflective layers include a metal reflective layer or a Bragg reflective layer.

39. The image sensor of claim 30, further comprising one or more processors configured to operate as a timing controller, a row decoder, and an output circuit.

40. An electronic device comprising the image sensor defined in claim 30.

41. The electronic device of claim 40, comprising one of: a mobile phone, a smartphone, a tablet, a smart tablet, a digital camera, a camcorder, a notebook computer, a television, a smart television, a smart refrigerator, a security camera, a robot, or a medical camera.

42. The image sensor of claim 30, wherein the spectral filter further comprises a third cavity, and the first cavity, the second cavity, and the third cavity are arranged in a two dimensional manner between the two first reflective layers, wherein the third cavity includes:
   the first etch stop layer disposed on the lower layer of the two first reflective layers,
   the first dielectric layer disposed on the first etch stop layer,
   the second etch stop layer disposed on the first dielectric layer, and
   the second dielectric layer disposed on the second etch stop layer,
wherein the second dielectric layer is disposed between the upper layer of the two first reflective layers and the second etch stop layer.

\* \* \* \* \*